US012701866B2

(12) United States Patent
Song et al.

(10) Patent No.: US 12,701,866 B2
(45) Date of Patent: Aug. 4, 2026

(54) DISPLAY APPARATUS, MASK FOR MANUFACTURING THE SAME, AND MANUFACTURING METHOD OF DISPLAY APPARATUS

(71) Applicant: Samsung Display Co., Ltd., Yongin-si (KR)

(72) Inventors: Eunho Song, Yongin-si (KR); Yeseul Na, Yongin-si (KR); Youngmo Koo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 476 days.

(21) Appl. No.: 18/321,071

(22) Filed: May 22, 2023

(65) Prior Publication Data

US 2024/0040849 A1 Feb. 1, 2024

(30) Foreign Application Priority Data

Jul. 27, 2022 (KR) ........................ 10-2022-0093460

(51) Int. Cl.
*H10K 59/122* (2023.01)
*H10K 71/13* (2023.01)
*H10K 71/16* (2023.01)
(52) U.S. Cl.
CPC ......... *H10K 59/122* (2023.02); *H10K 71/135* (2023.02); *H10K 71/166* (2023.02)
(58) Field of Classification Search
CPC .................................................. H10K 59/122
See application file for complete search history.

(56) References Cited

U.S. PATENT DOCUMENTS

| | | | |
|---|---|---|---|
| 6,373,453 B1 | 4/2002 | Yudasaka |
| 6,380,672 B1 | 4/2002 | Yudasaka |
| 6,642,651 B2 | 11/2003 | Yudasaka |
| 6,755,983 B2 | 6/2004 | Yudasaka |
| 6,806,504 B2 | 10/2004 | Park |
| 6,830,494 B1 | 12/2004 | Yamazaki et al. |

(Continued)

FOREIGN PATENT DOCUMENTS

| | | | | |
|---|---|---|---|---|
| CN | 102819180 A | * | 12/2012 | ......... G02B 27/0988 |
| CN | 110911457 A | * | 3/2020 | ........... H10K 50/824 |

(Continued)

OTHER PUBLICATIONS

Machine translation, Wu, Chinese Pat. Pub. No. CN102819180A, translation date: Sep. 26, 2025, Espacenet, all pages. (Year: 2025).*

(Continued)

*Primary Examiner* — Victoria K. Hall
(74) *Attorney, Agent, or Firm* — CANTOR COLBURN LLP

(57) ABSTRACT

A display apparatus includes a substrate, a pixel electrode disposed on the substrate, a first bank including a bank opening exposing a central portion of the pixel electrode, a second bank disposed on an outer side of the first bank and including a greater thickness than the first bank, an emission layer disposed in the bank opening and corresponding to the pixel electrode, an opposite electrode overlapping the first bank, the second bank, and the emission layer, wherein the first bank and the second bank each include a negative-type photoresist.

24 Claims, 17 Drawing Sheets

(56) References Cited

U.S. PATENT DOCUMENTS

| | | | |
|---|---|---|---|
| 6,838,192 B2 | 1/2005 | Miyashita et al. | |
| 7,015,503 B2 | 3/2006 | Seki et al. | |
| 7,214,959 B2 | 5/2007 | Seki et al. | |
| 7,273,801 B2 | 9/2007 | Seki et al. | |
| 7,291,970 B2 | 11/2007 | Kuwabara | |
| 7,307,381 B2 | 12/2007 | Ito et al. | |
| 8,431,182 B2 | 4/2013 | Kimura et al. | |
| 8,592,239 B2 | 11/2013 | Fennimore et al. | |
| 8,753,801 B2 | 6/2014 | Saie et al. | |
| 10,720,478 B2 | 7/2020 | Kondo | |
| 10,886,343 B2 | 1/2021 | Zhang et al. | |
| 2005/0009230 A1 | 1/2005 | Hasei | |
| 2010/0072889 A1 | 3/2010 | Takahashi et al. | |
| 2010/0181559 A1* | 7/2010 | Nakatani | H10K 59/122 |
| | | | 438/34 |
| 2016/0300894 A1* | 10/2016 | Park | H10K 59/124 |
| 2020/0012191 A1* | 1/2020 | Kamemoto | C08K 5/0041 |
| 2020/0043998 A1* | 2/2020 | Choi | H10K 50/11 |
| 2021/0191264 A1* | 6/2021 | Tanigaki | C08G 73/1017 |
| 2021/0359048 A1* | 11/2021 | Kim | H10K 71/135 |
| 2022/0130921 A1* | 4/2022 | Kim | H10K 59/88 |
| 2022/0320206 A1* | 10/2022 | Xu | H10K 59/122 |

FOREIGN PATENT DOCUMENTS

| | | | | |
|---|---|---|---|---|
| KR | 10-0569692 | 4/2006 | | |
| KR | 10-0955977 | 2/2008 | | |
| KR | 2008-0016929 | 2/2008 | | |
| KR | 1020080049910 A * | 6/2008 | ........ | H10K 50/8428 |
| KR | 1020100027150 A | 3/2010 | | |
| KR | 2011-0050409 | 5/2011 | | |
| KR | 10-1420470 | 7/2014 | | |
| KR | 1020180065386 A | 6/2018 | | |
| KR | 2020-0014463 | 2/2020 | | |
| KR | 2021-0020359 | 2/2021 | | |
| KR | 2022-0007788 | 1/2022 | | |

OTHER PUBLICATIONS

Machine translation, Seo, Korean Pat. Pub. No. KR20080049910A, translation date: Sep. 27, 2205, Espacenet, all pages. (Year: 2025).*

Machine translation, Zhang, Chinese Pat. Pub. No. CN110911457A, translation date: Sep. 27, 2205, Espacenet, all pages. (Year: 2025).*

Korean Intellectual Property Office, Request for the Submission of an Opinion, Korean Pat. App. No. 10-2022-0093460, Dec. 16, 2025, all pages. (Year: 2025).*

* cited by examiner

DPL

1

400

300

100

DISPLAY APPARATUS, MASK FOR MANUFACTURING THE SAME, AND MANUFACTURING METHOD OF DISPLAY APPARATUS

CROSS-REFERENCE TO RELATED APPLICATION(S)

This application claims priority to and benefits of Korean Patent Application No. 10-2022-0093460 under 35 U.S.C. § 119, filed on Jul. 27, 2022 in the Korean Intellectual Property Office (KIPO), the entire contents of which are incorporated herein by reference.

BACKGROUND

1. Technical Field

The disclosure relates to a display apparatus having improved display quality, a mask for manufacturing the same, and a method of manufacturing the display apparatus.

2. Description of the Related Art

In general, display apparatuses include pixels, which receive electrical signals and emit light in response, to display images. Pixels of organic light-emitting display devices (OLEDs) include organic light-emitting diodes as display elements. Each organic light-emitting diode includes a pixel electrode, an emission layer, and an opposite electrode. The emission layer of the organic light-emitting diode may be formed by discharging an ink including a light-emitting material onto the pixel electrode.

SUMMARY

However, in an existing display apparatus, an opposite electrode of an organic light-emitting diode may be disconnected because of a lower structure, and thus, the brightness of pixels may differ according to location of the pixels.

The disclosure achieves various technical goals including overcoming the aforementioned problem and provides a display apparatus, the display quality of which is improved by reducing a brightness difference between pixels according to location of the pixels, a mask for manufacturing the display apparatus, and a method of manufacturing the display apparatus. However, this is merely an example, and the scope of the disclosure is not limited thereto.

Additional aspects will be set forth in part in the description which follows and, in part, will be apparent from the description, or may be learned by practice of the embodiments of the disclosure.

According to one or more embodiments, a display apparatus may include a substrate, a pixel electrode disposed on the substrate, a first bank including a bank opening exposing a central portion of the pixel electrode, a second bank disposed on an outer side of the first bank and including a greater thickness than the first bank, an emission layer disposed in the bank opening and corresponding to the pixel electrode, an opposite electrode overlapping the first bank, the second bank, and the emission layer, wherein the first bank and the second bank each include a negative-type photoresist.

The first bank and the second bank may integral with each other.

A thickness of the first bank may be less than or equal to about half of a thickness of the second bank.

A thickness of the second bank may be about 300 nm to about 3 μm.

An angle formed by sidewalls of the first bank with an upper surface of the pixel electrode may be less than or equal to about 50°.

An angle formed by sidewalls of the second bank with an upper surface of the first bank may be less than or equal to about 50°.

A surface of each of the first bank and the second bank may be liquid-repellent.

The display apparatus may further include a spacer disposed on the substrate to be apart from the pixel electrode, and a third bank overlapping the spacer and protruding from an upper surface of the second bank.

The first bank, the second bank, and the third bank may be integral with each other.

The spacer may include a positive-type photoresist.

According to one or more embodiments, a method of manufacturing a display apparatus may include forming a pixel electrode on a substrate, forming, on the pixel electrode, a first organic layer including a negative-type photoresist, irradiating light onto the first organic layer by using a slit mask and developing the first organic layer into an organic pattern layer, forming a first bank and a second bank by heating the organic pattern layer, the first bank including a bank opening exposing a central portion of the pixel electrode, and the second bank being disposed on an outer side of the first bank and being greater in thickness than the first bank, forming an emission layer in the bank opening, in correspondence with the pixel electrode, and forming an opposite electrode to overlap the first bank, the second bank, and the emission layer.

The organic pattern layer may include a first pattern including a plurality of line patterns, and a second pattern disposed on an outer side of the first pattern.

Any one of the plurality of line patterns may overlap an edge of the pixel electrode.

Each of the plurality of line patterns may have a loop shape surrounding a central portion of the pixel electrode in plan view.

The method may further include forming a spacer that is apart from the pixel electrode, wherein the forming is performed between the forming of the pixel electrode and the forming of the first organic layer.

In the forming of the first bank and the second bank, a third bank overlapping the spacer and protruding from an upper surface of the second bank may be formed.

The spacer may include a positive-type photoresist.

The forming of the emission layer may include forming an emission layer by discharging ink comprising a light-emitting material into the bank opening.

An angle formed by sidewalls of the first bank with an upper surface of the pixel electrode may be less than or equal to about 50°.

An angle formed by sidewalls of the second bank with an upper surface of the first bank may be less than or equal to about 50°.

A surface of each of the first bank and the second bank may be liquid-repellent.

According to one or more embodiments, a mask used to manufacture a display apparatus may include a first mask pattern corresponding to a pixel electrode of the display apparatus, and a second mask pattern surrounding the first mask pattern and including a plurality of slits through which light passes.

In plan view, each of the plurality of slits may have a loop shape surrounding the first mask pattern.

Any one of the plurality of slits may correspond to an edge of the pixel electrode.

Other aspects, features, and advantages other than those described above will become apparent from the following detailed description, claims and drawings for carrying out the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
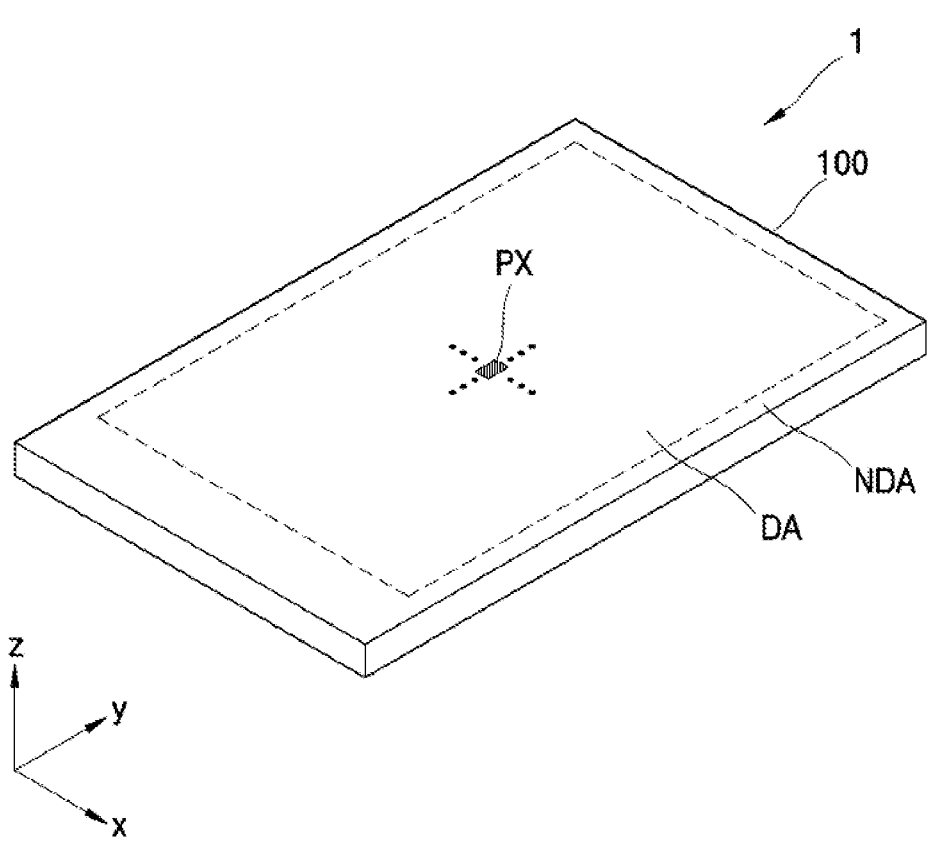
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

It will be understood that although the terms "first," "second," etc. may be used herein to describe various elements, these elements should not be limited by these terms, and these elements are only used to distinguish one element from another.

As used herein, the singular forms "a," "an," and "the" are intended to include the plural forms as well, unless the context clearly indicates otherwise.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

It will be understood that when a layer, region, or element is referred to as being "formed on" another layer, region, or element, it can be directly or indirectly formed on the other layer, region, or element. For example, for example, intervening layers, regions, or elements may be present.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Some embodiments may include a specific process order that may be performed differently from a described order. For example, two consecutively described processes may be performed substantially at the same time or performed in an order opposite to the described order.

Sizes of elements in the drawings may be exaggerated for convenience of explanation. In other words, since sizes and thicknesses of elements in the drawings may be arbitrarily illustrated for convenience of explanation, the following embodiments are not limited thereto.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic perspective view of a display apparatus 1 according to an embodiment.

Referring to FIG. 1, the display apparatus 1 may include a display area DA and a non-display area NDA on a substrate 100.

In the display area DA, images may be produced. In the display area DA, pixels PX may be disposed on a plane. In the specification, a pixel PX may refer to a sub-pixel emitting light of a different color and may be, for example, any of a red sub-pixel, a green sub-pixel, and a blue sub-pixel. The display apparatus 1 may provide images by using light emitted from the pixels PX.

The non-display area NDA is an area where no images may be provided and no pixels PX may be arranged (disposed). The non-display area NDA may entirely surround the display area DA. In the non-display area NDA, drivers or voltage lines may be disposed and configured to provide electrical signals or power to the pixels PX. In the non-display area NDA, a pad portion (not shown) may be included that may be electrically connected to an electronic component or a printed circuit board.

The display area DA may have a polygonal shape. For example, the display area DA may have a rectangular shape in which a horizontal length is greater than a vertical length, as shown in FIG. 1. In other embodiments, the display area DA may have a square shape. In other embodiments, the display area DA may have various shapes such as an oval shape and/or a circular shape.

Figure 2:
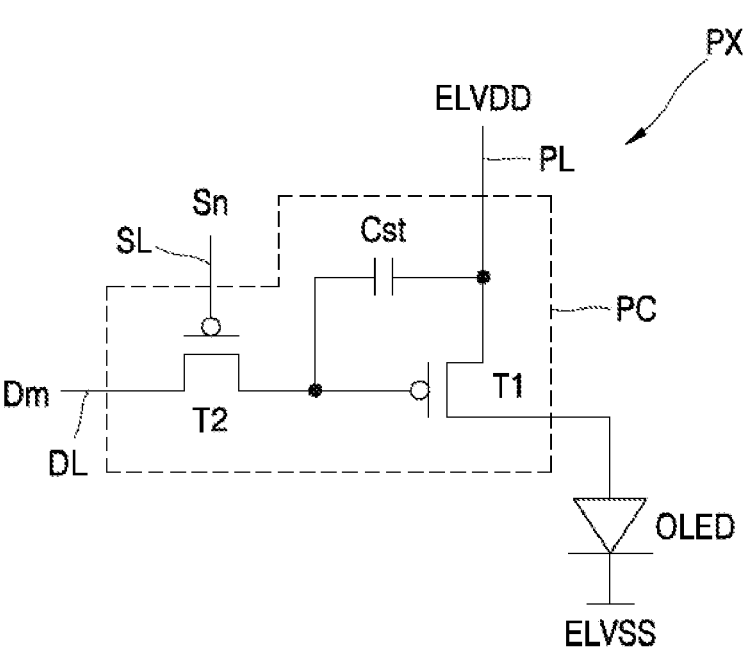
FIG. 2 is an equivalent circuit diagram of any of pixels included in a display apparatus, according to an embodiment.

FIG. 2 is an equivalent circuit diagram of any of the pixels PX included in a display apparatus, according to an embodiment.

Referring to FIG. 2, the pixel PX may include a pixel circuit PC and a display element, for example, an organic light-emitting diode OLED, which is connected to the pixel circuit PC. The pixel circuit PC may include a first thin-film transistor T1, a second thin-film transistor T2, and a storage capacitor Cst. Each pixel PX may emit, for example, red light, green light, or blue light or emit red light, green light, blue light, or white light by using the organic light-emitting diode OLED.

The second thin-film transistor T2 may be a switching thin-film transistor and may be connected to a scan line SL and a data line DL and configured to transmit, to the first thin-film transistor T1, a data voltage or a data signal Dm that is input from the data line DL according to a switching voltage or a switching signal Sn that is input from the scan line SL. The storage capacitor Cst may be connected to the second thin-film transistor T2 and a driving power line PL and configured to store a voltage corresponding to a difference between a voltage from the second thin-film transistor T2 and a first power voltage ELVDD provided to the driving power line PL.

The first thin-film transistor T1 may be a driving thin-film transistor and may be connected to the driving power line PL and the storage capacitor Cst and configured to control a driving current flowing in the organic light-emitting diode OLED from the driving power line PL according to the voltage stored in the storage capacitor Cst. The organic light-emitting diode OLED may emit light having a certain brightness because of the driving current. An opposite electrode (e.g., a cathode) of the organic light-emitting diode OLED may receive a second power voltage ELVSS.

FIG. 2 shows that the pixel circuit PC includes two thin-film transistors and one storage capacitor, but according to another embodiment, the number of thin-film transistors and the number of storage capacitors may vary according to the design of the pixel circuit PC.

Figure 3A:
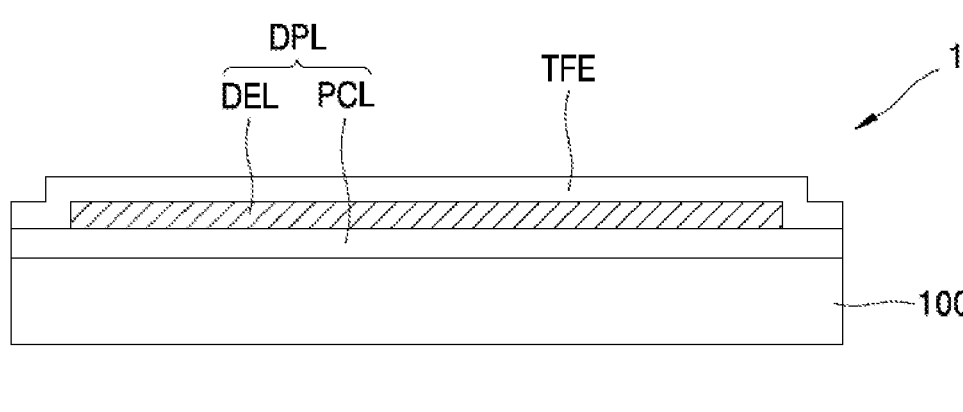
FIGS. 3A and 3B are schematic cross-sectional views of a display apparatus according to one or more embodiments.
Figure 3A:
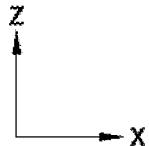
Figure 3B:
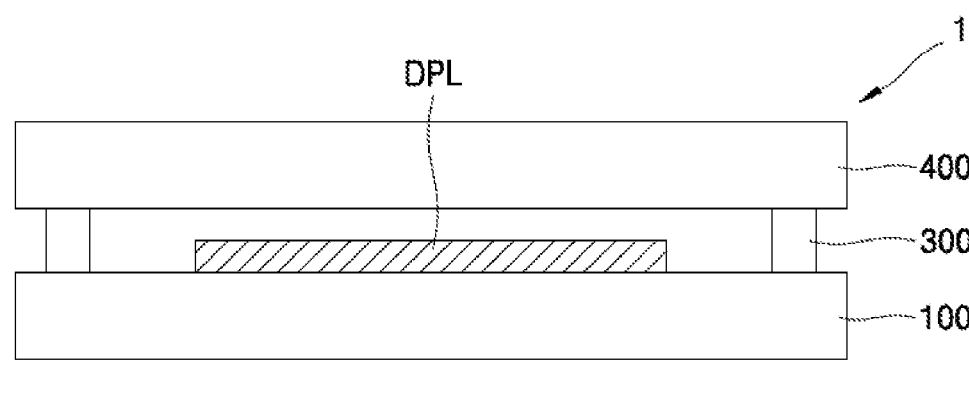
Figure 3B:
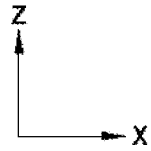

FIG. 3A is a schematic cross-sectional view of the display apparatus 1 according to an embodiment. FIG. 3B is a schematic cross-sectional view of the display apparatus 1 according to another embodiment.

Referring to FIG. 3A, on the substrate 100 of the display apparatus 1, a display layer DPL and a thin-film encapsulation layer TFE may be arranged. The display layer DPL may include a pixel circuit layer PCL including a pixel circuit and insulating layers, and a display element layer DEL arranged on the pixel circuit layer PCL and including display elements.

The substrate 100 may include a glass material, metals, and/or polymer resin. The polymer resin may include, for example, polyethersulphone, polyacrylate, polyetherimide (PI), polyethylene naphthalate, polyethylene terephthalate (PET), polyphenylene sulfide, polyarylate, polyimide, polycarbonate, cellulose acetate propionate, or a mixture thereof. Various modifications may be made to the substrate 100. For example, the substrate 100 may have a multilayered structure that includes two layers including the above polymer resin and a barrier layer arranged therebetween and including an inorganic material (e.g., silicon oxide ($SiO_x$), silicon nitride ($SiN_x$), silicon oxynitride (SiON), and/or the like).

The display element layer DEL may include display elements, for example, organic light-emitting diodes. The pixel circuit layer PCL may include a pixel circuit and insulating layers connected to the organic light-emitting diodes. For example, the pixel circuit layer PCL may include transistors, storage capacitors, and insulating layers arranged therebetween.

The display elements may be covered by an encapsulation member such as the thin-film encapsulation layer TFE. The thin-film encapsulation layer TFE may include at least one inorganic encapsulation layer and at least one organic encapsulation layer that cover the display element layer DEL. The inorganic encapsulation layer may include an inorganic insulating material such as aluminum oxide ($Al_2O_3$), titanium oxide ($TiO_2$), tantalum oxide ($Ta_2O_5$), hafnium oxide ($HfO_2$), zinc oxide (ZnO), $SiO_x$, $SiN_x$, and/or SiON. The organic encapsulation layer may include a polymer-based material. The polymer-based material may include acrylic resin, epoxy-based resin, polyimide, polyethylene, and/or the like. In an embodiment, the organic encapsulation layer may include acrylate.

Referring to FIG. 3B, the display layer DPL and a sealing substrate 400 may be arranged on the substrate 100 of the display apparatus 1. A sealing member 300 may be arranged between the substrate 100 and the sealing substrate 400. The sealing substrate 400 may include a transparent member. The substrate 100 may be coupled to the sealing substrate 400 by the sealing member 300, and thus, an internal space between the substrate 100 and the sealing substrate 400 may be sealed. A moisture absorbent, a filler, or the like may be located in the internal space. The sealing member 300 may be a sealant, and in another embodiment, the sealing member 300 may include a material cured by laser. For example, the sealing member 300 may be frit. In detail, the sealing member 300 may include an organic sealant such as urethane-based resin, epoxy-based resin, and/or acrylic resin, or an inorganic sealant such as silicon. The urethane-based resin may include, for example, urethane acrylate, or the like. The acrylic resin may include, for example, butyl acrylate, ethylhexyl acrylate, and/or the like. In other embodiments, the sealing member 300 may include a material cured by heat.

In some embodiments, the display element layer DEL may be covered together with the thin-film encapsulation layer TFE of FIG. 3A by the sealing substrate 400 and the sealing member 300 of FIG. 3B.

A touch electrode layer (not shown) may be arranged on the thin-film encapsulation layer TFE and/or the sealing substrate 400, and an optical functional layer (not shown) may be arranged on the touch electrode layer. The touch electrode layer may obtain information according to an external input, e.g., a touch event. The optical functional layer may reduce reflectivity of light (external light) that is incident towards the display apparatus 1 from the outside thereof. In other embodiments, the optical functional layer may improve color purity of light emitted from the display apparatus 1. In an embodiment, the optical functional layer may include a retarder and/or a polarizer. The retarder may be of a film type or a liquid crystal coating type and may include a λ/2 retarder and/or a λ/4 retarder. The polarizer may also be of a film type or a liquid crystal coating type. The film type may include a stretched synthetic resin film, and the liquid crystal coating type may include liquid crystals arranged in a certain arrangement. The retarder and the polarizer may further include a protective film.

In another embodiment, the optical functional layer may include a black matrix and color filters. The color filters may be arranged considering colors of light respectively emitted from the pixels PX of the display apparatus 1. Each color filter may include a red, green, or blue pigment or dye. In other embodiments, each color filter may further include quantum dots in addition to the above pigment or dye. In other embodiments, some of the color filters may not include the above pigment or dye and may include scattered particles such as $TiO_2$.

An adhesive member may be arranged between the touch electrode layer and the optical functional layer. General adhesive members may be employed without limitation. In an embodiment, the adhesive member may be a pressure-sensitive adhesive (PSA).

Figure 4:
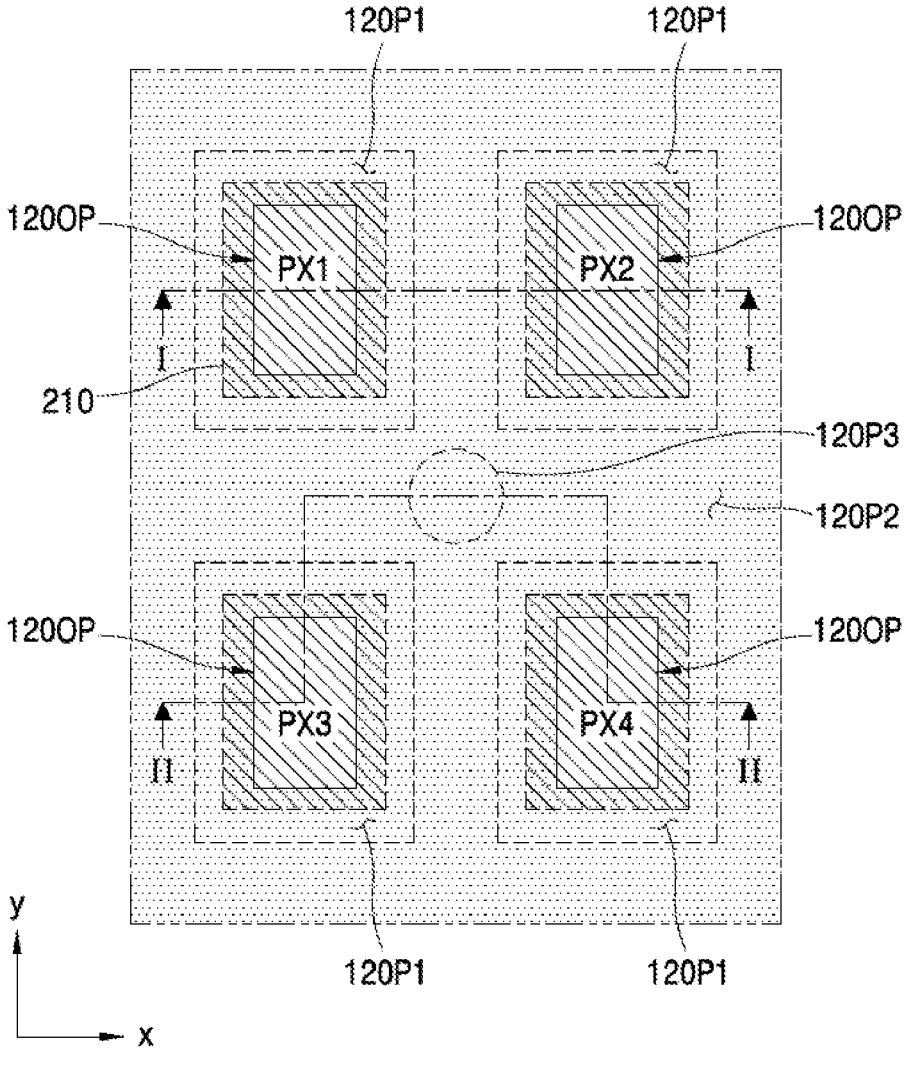
FIG. 4 is a schematic plan view of a display apparatus according to an embodiment.

FIG. 4 is a schematic plan view of a display apparatus according to an embodiment. FIG. 4 schematically shows an enlarged portion of the display area DA of the display apparatus 1 of FIG. 1 and shows pixel electrodes 210 two-dimensionally arranged in plan view, and a bank layer 120 including bank openings 120OP exposing central portions of the pixel electrodes 210.

The pixel electrodes 120 may be arranged apart from each other in a first direction (e.g., a y direction) and a second direction (e.g., an x direction). In this regard, FIG. 4 shows that the pixel electrodes 210 are arranged apart from each other, corresponding to a first pixel PX1, a second pixel PX2, a third pixel PX3, and a fourth pixel PX4, respectively.

In an embodiment, in plan view, the pixel electrodes 210 may have various shapes such as a rectangle, a rhombus, a square, a circle, and/or an oval. In this regard, FIG. 4 shows that the pixel electrodes 210 each have a rectangular shape having long sides in the first direction (e.g., the y direction), but one or more embodiments are not limited thereto.

In an embodiment, the pixel electrode 210 may include a conductive material including molybdenum (Mo), aluminum (Al), copper (Cu), and/or titanium (Ti) and may be a layer or layers including the above material. In an embodiment, the pixel electrode 210 may include conductive oxide such as indium tin oxide (ITO), indium zinc oxide (IZO), zinc oxide (ZnO), indium oxide ($In_2O_3$), indium gallium oxide (IGO), and/or aluminum zinc oxide (AZO). In an embodiment, the pixel electrode 210 may include a reflection film including silver (Ag), magnesium (Mg), Al, platinum (Pt), palladium (Pd), gold (Au), nickel (Ni), neodymium (Nd), iridium (Ir), chromium (Cr), or a compound thereof. In an embodiment, the pixel electrode 210 may have a multilayered structure of ITO/Ag/ITO.

In an embodiment, a surface of the pixel electrode 210 may be lyophilic. In the specification, the term "lyophilic" indicates an excellent affinity for a certain solution, whereas the term "liquid-repellent" indicates that a certain solution is pushed away and does not permeate well.

For example, a certain solution has great surface coupling with a lyophilic surface, and surface tension of the certain solution on the lyophilic surface may decrease. A certain solution has low surface coupling with a liquid-repellent surface, and surface tension of the certain solution on the liquid-repellent surface may increase.

As a lyophilic property increases or surface tension decreases, a contact angle, which is an angle formed by a tangent line of a surface of a certain solution with a surface on which the certain solution is located, may be reduced. As described, as liquid repellency or surface tension increases, a contact angle formed by a certain surface with a surface, on which a certain solution is located, may increase.

Here, the certain solution may be ink or a solvent of ink including a light-emitting material forming an emission layer.

The bank layer 120 may include first banks 120P1 respectively covering edges of the pixel electrodes 210 and second banks 120P2 respectively surrounding the first banks 120P1. The first bank 120P1 may define the bank opening 120OP exposing a central portion of the pixel electrode 210.

The bank opening 120OP may have a shape similar to that of its corresponding pixel electrode 210. In this regard, FIG. 4 shows that the bank opening 120OP has a rectangular shape having long sides in the first direction (e.g., the y direction). The bank opening 120OP may have a shape different from that of its corresponding pixel electrode 210.

An emission area of a display element may be defined by the bank opening 120OP, and in the specification, a shape and a location of a pixel may denote a shape and a location of the emission area of the display element.

FIG. 4 shows that the first pixel PX1 to the fourth pixel PX4 have the same size (or the same area), but according to colors of emitted light, sizes (or areas) of pixels may differ. For example, a size (or an area) of a pixel emitting green light may be less than that of a pixel emitting red light or blue light.

Because the first bank 120P1 covers the edges of the pixel electrode 210, the first bank 120P1 may have a shape similar to shapes of the edges of the pixel electrode 210. In this regard, FIG. 4 shows that the bank opening 120OP has a rectangular shape having long sides in the first direction (e.g., the y direction).

The second bank 120P2 may be arranged on an outer side of the first bank 120P1 and have a greater thickness than the first bank 120P1. In an embodiment, in plan view, the second banks 120P2 may have a lattice shape surrounding the first banks 120P1, and the pixel electrodes 210 may be arranged in a lattice formed by the second banks 120P2. The first bank 120P1 may be formed integrally with the second bank 120P2.

In an embodiment, a third bank 120P3 may be arranged between the pixel electrodes 210. The third bank 120P3 may be apart from the pixel electrodes 210. The third bank 120P3 may be surrounded by the second bank 120P2, and a height of an upper surface of the third bank 120P3 may be greater than a height of an upper surface of the second bank 120P2. In other words, the third bank 120P3 may protrude from the upper surface of the second bank 120P2.

In an embodiment, the third bank 120P3 may support a structure arranged thereon. For example, in case that the sealing substrate 400 is arranged on an upper surface of the substrate 100 as shown in FIG. 3B, the third bank 120P3 may maintain a cell gap between the substrate 100 and the sealing substrate 400.

In plan view, the third bank 120P3 may have various shapes such as a rectangle, a rhombus, a square, a circle, and/or an oval. In this regard, FIG. 4 shows that the third bank 120P3 has a circular shape, but one or more embodiments are not limited thereto.

The first bank 120P1, the second bank 120P2, and the third bank 120P3 may be integrally formed. For example, the bank layer 120 may be integrally formed over the entire substrate 100 (see FIG. 5).

In an embodiment, the bank layer 120 may include a photoresist, for example, photosensitive resin. In detail, the bank layer 120 may include a negative-type photoresist in which a reaction such as crosslinking occurs during light exposure. In an embodiment, a surface of the bank layer 120 may be liquid-repellent. In particular, an upper surface of the bank layer 120 may be liquid-repellent.

For example, the bank layer 120 may include one or more of a fluorine-based monomer and a fluorine-based polymer containing the fluorine-based monomer. Here, the fluorine-based monomer may contain a fluorine atom and/or an alkyl group in which at least one hydrogen atom is substituted with a fluorine atom. The fluorine-based polymer may have a repeat unit derived from the above fluorine-based monomer and may be a homopolymer or a copolymer.

A fluorine atom exposed on the surface of the bank layer 120, the alkyl group in which at least one hydrogen atom is substituted with a fluorine atom, and/or the like may improve the liquid repellency of the surface of the bank layer 120. Because the surface of the bank layer 120 has the liquid repellency, materials for forming emission layers, which are discharged during an inkjet process of the first pixel PX1 to the fourth pixel PX4, may be located only in the bank opening 120OP. Therefore, the materials for forming the emission layers may not flow over the upper surface of the first bank 120P1, and the emission layers may be formed at desired locations.

Figure 5:
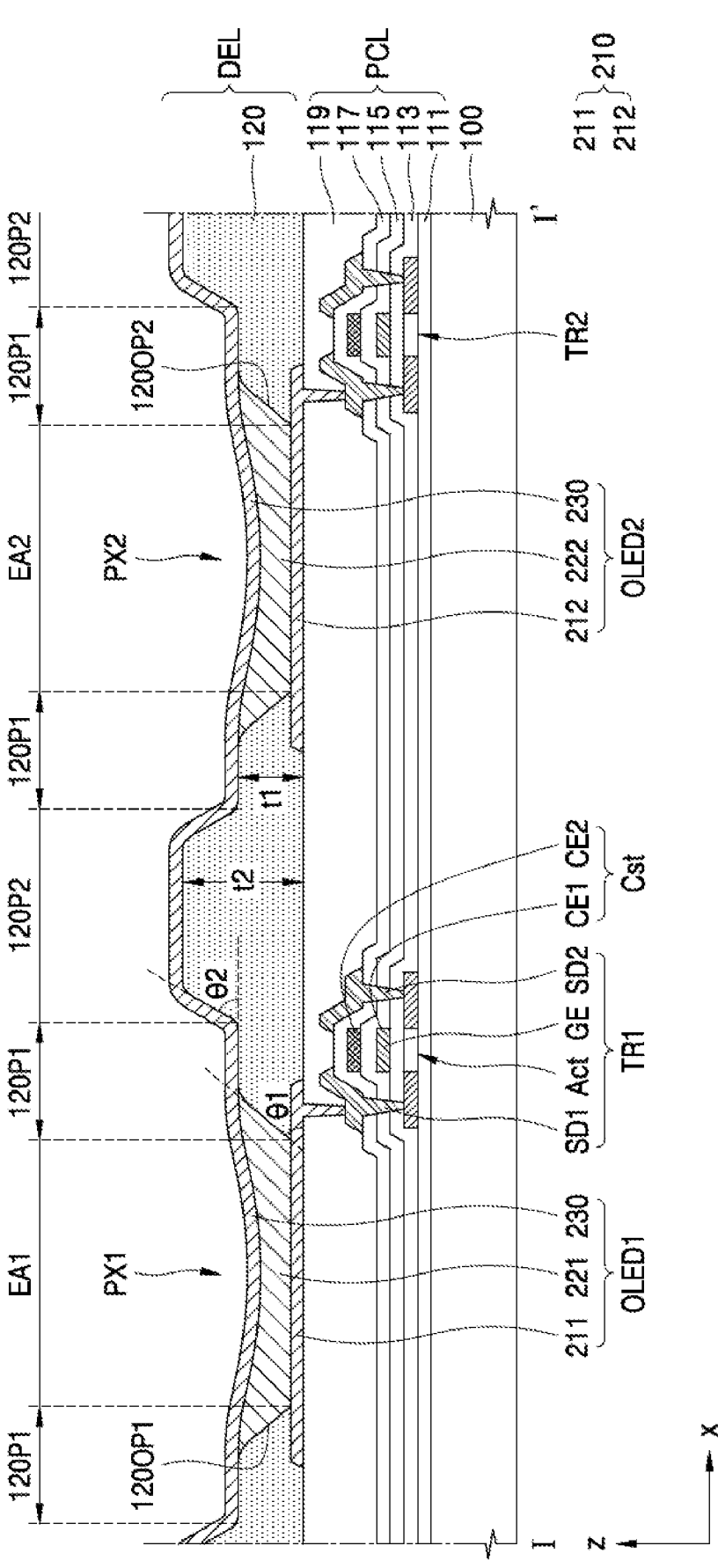
FIG. 5 is a schematic cross-sectional view of the display apparatus of FIG. 4, taken along line I-I' of FIG. 4.
Figure 6:
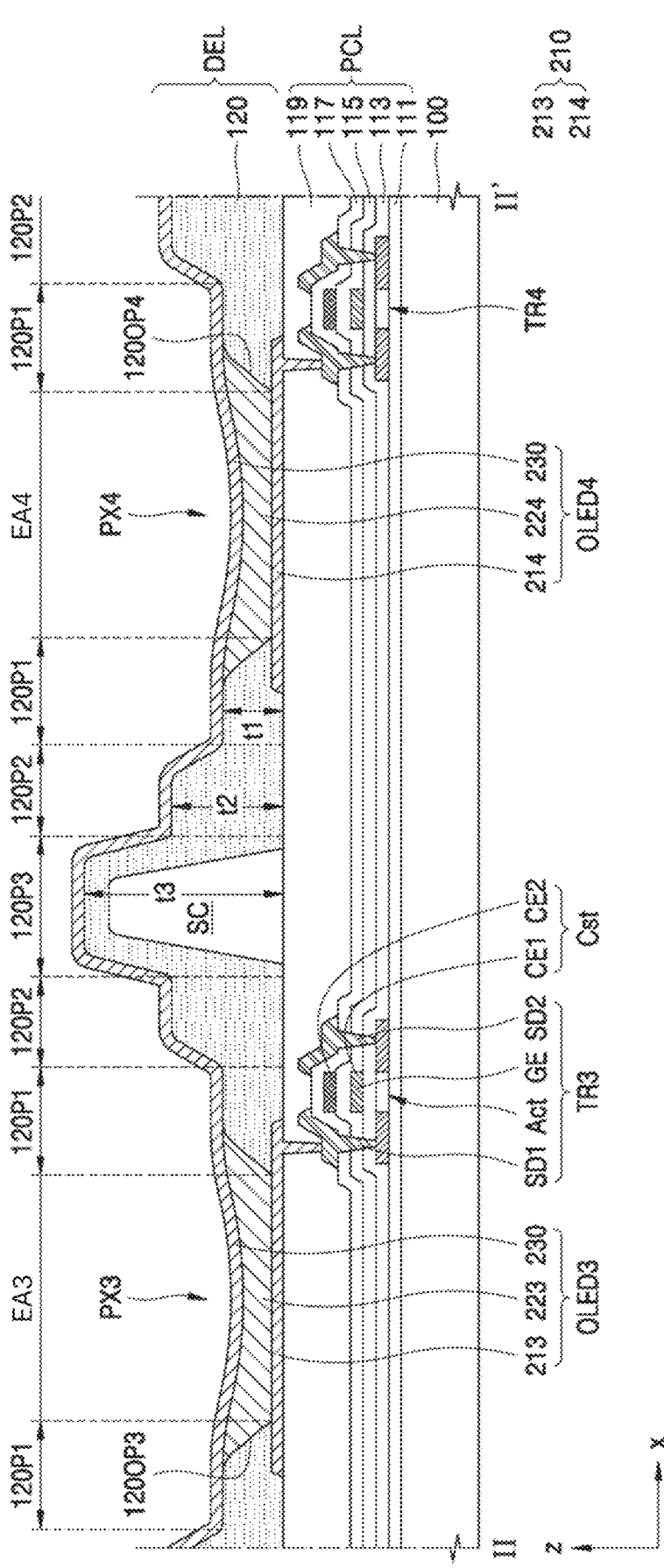
FIG. 6 is a schematic cross-sectional view of the display apparatus of FIG. 4, taken along line II-II' of FIG. 4.

FIG. 5 is a schematic cross-sectional view of the display apparatus of FIG. 4 taken along line I-I' of FIG. 4, and FIG. 6 is a schematic cross-sectional view of the display apparatus of FIG. 4 taken along line II-II' of FIG. 4.

Referring to FIGS. 5 and 6, the pixel circuit layer PCL may be disposed on the substrate 100. The pixel circuit layer PCL may include a first transistor TR1 to a fourth transistor TR4, a buffer layer 111, a first gate insulating layer 113, a second gate insulating layer 115, an interlayer insulating layer 117, and a planarization layer 119 arranged on and/or under components of the first transistor TR1 to the fourth transistor TR4. Each of the first transistor TR1 to the fourth transistor TR4 may correspond to the first thin-film transistor T1 of FIG. 2. Structures of the second transistor TR2 to the fourth transistor TR4 may be the same as or similar to a structure of the first transistor TR1, and thus, repeated descriptions thereof are omitted.

The buffer layer 111 may include an inorganic insulating material such as $SiN_x$, SiON, and/or $SiO_x$ and may be a layer or layers including the above inorganic insulating material. The buffer layer 111 may increase the flatness of the upper surface of the substrate 100 and prevent or decrease the penetration of impurities to a semiconductor layer Act from the substrate 100.

The first transistor TR1 may include the semiconductor layer Act, and the semiconductor layer Act may include polysilicon. In other embodiments, the semiconductor layer Act may include amorphous silicon, an oxide semiconductor material, and/or an organic semiconductor material.

A gate electrode GE may overlap a portion of the semiconductor layer Act. The gate electrode GE may include a conductive material. For example, the gate electrode GE may include a conductive material including Mo, Al, and/or Ti and may be a layer or layers including the above material.

The first gate insulating layer 113 between the semiconductor layer Act and the gate electrode GE may include an inorganic insulating material such as $SiO_2$, $SiN_x$, SiON, $Al_2O_3$, $TiO_2$, $Ta_2O_5$, $HfO_2$, and/or $ZnO_2$.

The second gate insulating layer 115 may cover the gate electrode GE. Similarly to the first gate insulating layer 113, the second gate insulating layer 115 may include an inorganic insulating material such as $SiO_2$, $SiN_x$, SiON, $Al_2O_3$, $TiO_2$, $Ta_2O_5$, $HfO_2$, and/or $ZnO_2$.

On the second gate insulating layer 115, an upper electrode CE2 of the storage capacitor Cst may be disposed. The upper electrode CE2 may overlap the gate electrode GE arranged thereunder. The gate electrode GE and the upper electrode CE2, which overlap each other with the second gate insulating layer 115 therebetween, may form the storage capacitor Cst. For example, the gate electrode GE may function as a lower electrode CE1 of the storage capacitor Cst.

As described, the storage capacitor Cst may overlap the first transistor TR1. In some embodiments, the storage capacitor Cst may not overlap the first transistor TR1.

The upper electrode CE2 may include a conductive material such as Al, Pt, Pd, Ag, Mg, Au, Ni, Nd, Ir, Cr, Ca, Mo, Ti, W, and/or Cu and may be a layer or layers including the above material(s).

The interlayer insulating layer 117 may cover the upper electrode CE2. The interlayer insulating layer 117 may include an inorganic insulating material such as $SiO_x$, $SiN_x$, SiON, $Al_2O_3$, $TiO_2$, $Ta_2O_5$, $HfO_2$, and/or $ZnO_2$. The interlayer insulating layer 117 may have a single-layer structure or a multilayered structure including the above inorganic insulating material.

A drain electrode SD1 and a source electrode SD2 may each be disposed on the interlayer insulating layer 117. The drain electrode SD1 and the source electrode SD2 may each be electrically connected to the semiconductor layer Act through a contact hole formed in the first gate insulating layer 113, the second gate insulating layer 115, and the interlayer insulating layer 117. The drain electrode SD1 and the source electrode SD2 may each include a material with good conductivity. The drain electrode SD1 and the source electrode SD2 may each include a conductive material including Mo, Al, Cu, and/or Ti and may have a single-layer structure or a multilayered structure including the above material. In an embodiment, the drain electrode SD1 and the source electrode SD2 may have a multilayered structure of Ti/Al/Ti. In an embodiment, any of the drain electrode SD1 and the source electrode SD2 may be omitted, and a portion of the semiconductor layer Act may become conductive, thus substituting the drain electrode SD1 and the source electrode SD2.

The planarization layer 119 may cover the first transistor TR1 and include a contact hole exposing a portion of the first transistor TR1. The planarization layer 119 may include an organic insulating layer. The planarization layer 119 may include organic insulating materials such as a general-purpose polymer such as polymethylmethacrylate (PMMA)

or polystyrene (PS), a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, and any blend thereof.

The display element layer DEL may be disposed on the pixel circuit layer PCL. The display element layer DEL may include a first organic light-emitting diode OLED1 to a fourth organic light-emitting diode OLED4, and the bank layer 120 arranged on/under the components of the first organic light-emitting diode OLED1 to a fourth organic light-emitting diode OLED4. Because structures of the second organic light-emitting diode OLED2 to the fourth organic light-emitting diode OLED4 may be the same as or similar to a structure of the first organic light-emitting diode OLED1, repeated descriptions thereof are omitted.

In an embodiment, a first pixel electrode 211 may be disposed on the pixel circuit layer PCL. The first pixel electrode 211 may be electrically connected to the drain electrode SD1 or the source electrode SD2 of the first transistor TR1 through a contact hole penetrating the pla-narization layer 119. As shown in FIG. 5, the first pixel electrode 211 may be apart from the second pixel electrode 212 by a certain distance in the second direction (e.g., the x direction). As described, as shown in FIG. 6, a third pixel electrode 213 may be apart from a fourth pixel electrode 214 by a certain distance in the second direction (e.g., the x direction).

The bank layer 120 may be disposed on the pixel circuit layer PCL. The bank layer 120 may include the first bank 120P1 covering the edges of the first pixel electrode 211 and the second bank 120P2 arranged on an outer side of the first bank 120P1.

The first bank 120P1 may define a first bank opening 120OP1 exposing a central portion of the first pixel elec-trode 211, a second bank opening 120OP2 exposing a central portion of the second pixel electrode 212, a third bank opening 120OP3 exposing a central portion of the third pixel electrode 213, and a fourth bank opening 120OP4 exposing a central portion of the fourth pixel electrode 214. For example, the first bank 120P1 may define an emission area EA1 of the first organic light-emitting diode OLED1, an emission area EA2 of the second organic light-emitting diode OLED2, an emission area EA3 of the third organic light-emitting diode OLED3, and an emission area EA4 of the fourth organic light-emitting diode OLED4. The first bank 120P1 may prevent arcs, etc. from being generated at the edges of the pixel electrode 210 by increasing a distance between the edges of the pixel electrode 210 and an opposite electrode 230.

As described above, the second bank 120P2 may be arranged on the outer side of the first bank 120P1 in plan view. The second bank 120P2 may be greater in thickness than the first bank 120P1. A second thickness t2 of the second bank 120P2 may be greater than a first thickness t1 of the first bank 120P1 and may be sufficient enough to separate the material for forming an emission layer dis-charged during an inkjet printing process. The first thickness t1 of the first bank 120P1 may be less than or equal to half of the second thickness t2 of the second bank 120P2.

The second thickness t2 of the second bank 120P2 may be between about 300 nm and about 3 μm. In an embodiment, the second thickness t2 of the second bank 120P2 may be about 1 μm, and the first thickness t1 of the first bank 120P1 may be about 500 nm.

The first bank 120P1 may be integrally formed with the second bank 120P2. For example, the first bank 120P1 may include the same material as the second bank 120P2. The first bank 120P1 and the second bank 120P2 may be simultaneously formed through a photolithography process using a slit mask. An upper surface of the first bank 120P1 and an upper surface of the second bank 120P2 may be connected to each other by sidewalls of the second bank 120P2 having a gentle slope. As described above, the first bank 120P1 and the second bank 120P2 may each include a negative-type photoresist.

In an embodiment, an angle θ1 formed by sidewalls of the first bank 120P1 defining the first bank opening 120OP1 with the upper surface of the first pixel electrode 211 may be less than or equal to about 50°. An angle θ2 formed by the sidewalls of the second bank 120P2 for connecting the upper surface of the first bank 120P1 to the upper surface of the second bank 120P2 with the upper surface of the first bank 120P1 may be less than or equal to about 50°.

As shown in FIG. 6, a spacer SC may be disposed under the bank layer 120. In other words, the spacer SC may be disposed between the planarization layer 119 and the bank layer 120. The spacer SC may be apart from the pixel electrodes 210.

The spacer SC may have a certain height to make a step difference with a portion having no spacer SC. The spacer SC may have various shapes such as a hemispherical shape, a cylindrical shape, a conical shape, a pyramid shape, and a prismatic shape.

The spacer SC may include photosensitive resin. In an embodiment, the spacer SC may include a positive-type photoresist.

The third bank 120P3 may overlap the spacer SC. The third bank 120P3 may be surrounded by the second bank 120P2, and an upper surface of the third bank 120P3 may protrude from the upper surface of the second bank 120P2. For example, a third thickness t3 of the third bank 120P3 from the upper surface of the planarization layer 119 to the upper surface of the third bank 120P3 may be greater than the second thickness t2 of the second bank 120P2. There-fore, the third bank 120P3 may support a structure arranged thereon.

The first bank 120P1, the second bank 120P2, and the third bank 120P3 may be integrally formed. For example, the first bank 120P1, the second bank 120P2, and the third bank 120P3 may include the same material. The first bank 120P1, the second bank 120P2, and the third bank 120P3 may be simultaneously formed through a photolithography process using a slit mask. As described above, the first bank 120P1, the second bank 120P2, and the third bank 120P3 may each include a negative-type photoresist.

Referring back to FIG. 5, a first emission layer 221 may be disposed on the first pixel electrode 211. For example, the first emission layer 221 may be in the first bank opening 120OP1. As described, a second emission layer 222 may be in the second bank opening 120OP2, a third emission layer 223 may be in the third bank opening 120OP3, and a fourth emission layer 224 may be in the fourth bank opening 120OP4. The first emission layer 221 to the fourth emission layer 224 may each include a high-molecular-weight organic material or a low-molecular-weight organic material that emits a certain color of light. The first emission layer 221 may be formed by discharging the material for forming an emission layer on the first pixel electrode 211. For example, the first emission layer 221 to the fourth emission layer 224 may be formed through the inkjet printing process.

Although not shown, the first emission layer 221 may include a first functional layer and/or a second functional layer respectively arranged under and on the first emission layer 221. The first functional layer may include, for example, a Hole Transport Layer (HTL) or both an HTL and a Hole Injection Layer (HIL). The second functional layer may be selectively arranged. The second functional layer may include an Electron Transport Layer (ETL) and/or an Electron Injection Layer (EIL).

The first emission layer 221 may have a concave shape in which a thickness increases from a central portion of the first emission layer 221 to an edge of the first bank opening 120OP1. Because the surface of the bank layer 120 is liquid-repellent, the first emission layer 221 to the fourth emission layer 224 may not be disposed on the upper surface of the bank layer 120.

The opposite electrode 230 may cover the first emission layer 221 and the bank layer 120. For example, the opposite electrode 230 may be integrally formed over the entire substrate 100 to cover the first bank 120P1, the second bank 120P2, and the third bank 120P3.

The opposite electrode 230 may include a conductive material having a low work function. For example, the opposite electrode 230 may include a (translucent) transparent layer including Ag, Mg, Al, Pt, Pd, Au, Ni, Nd, Ir, Cr, lithium (Li), calcium (Ca), or an alloy thereof. In other embodiments, the opposite electrode 230 may further include a layer including ITO, IZO, ZnO, and/or $In_2O_3$ on the (translucent) transparent layer including the above material.

As a Comparative Example, in case that an angle formed by sidewalls of a bank layer and an upper surface of a pixel electrode is greater than about 50°, an opposite electrode having a low step coverage may be disconnected. Because of the disconnection of the opposite electrode, an electron injection characteristic of an organic light-emitting diode degrades, and thus, a brightness difference according to a location of the display apparatus may occur. In the display apparatus 1 (see FIG. 1), the bank layer 120 includes the first bank 120P1 and the second bank 120P2 that have different thicknesses, and the sidewalls of the first bank 120P1, which connect the upper surface of the pixel electrode 210 to the upper surface of the first bank 120P1, and the sidewalls of the second bank 120P2, which connect the upper surface of the first bank 120P1 to the upper surface of the second bank 120P2, may have gentle slopes. Therefore, the display apparatus 1 having improved display quality may be provided by decreasing or preventing the disconnection of the opposite electrode 230.

Although not shown, in an embodiment, a thin-film encapsulation layer or an encapsulation substrate may be arranged on the opposite electrode 230.

Figure 7:
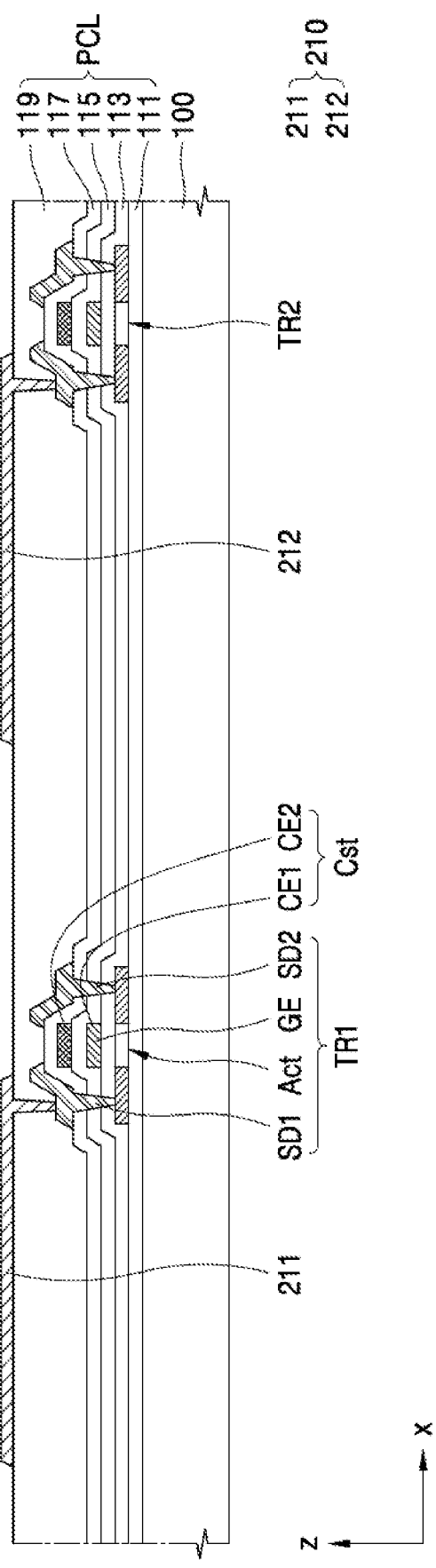
FIGS. 7 to 13 are schematic cross-sectional views of a method of manufacturing a display apparatus, according to an embodiment.
Figure 8:
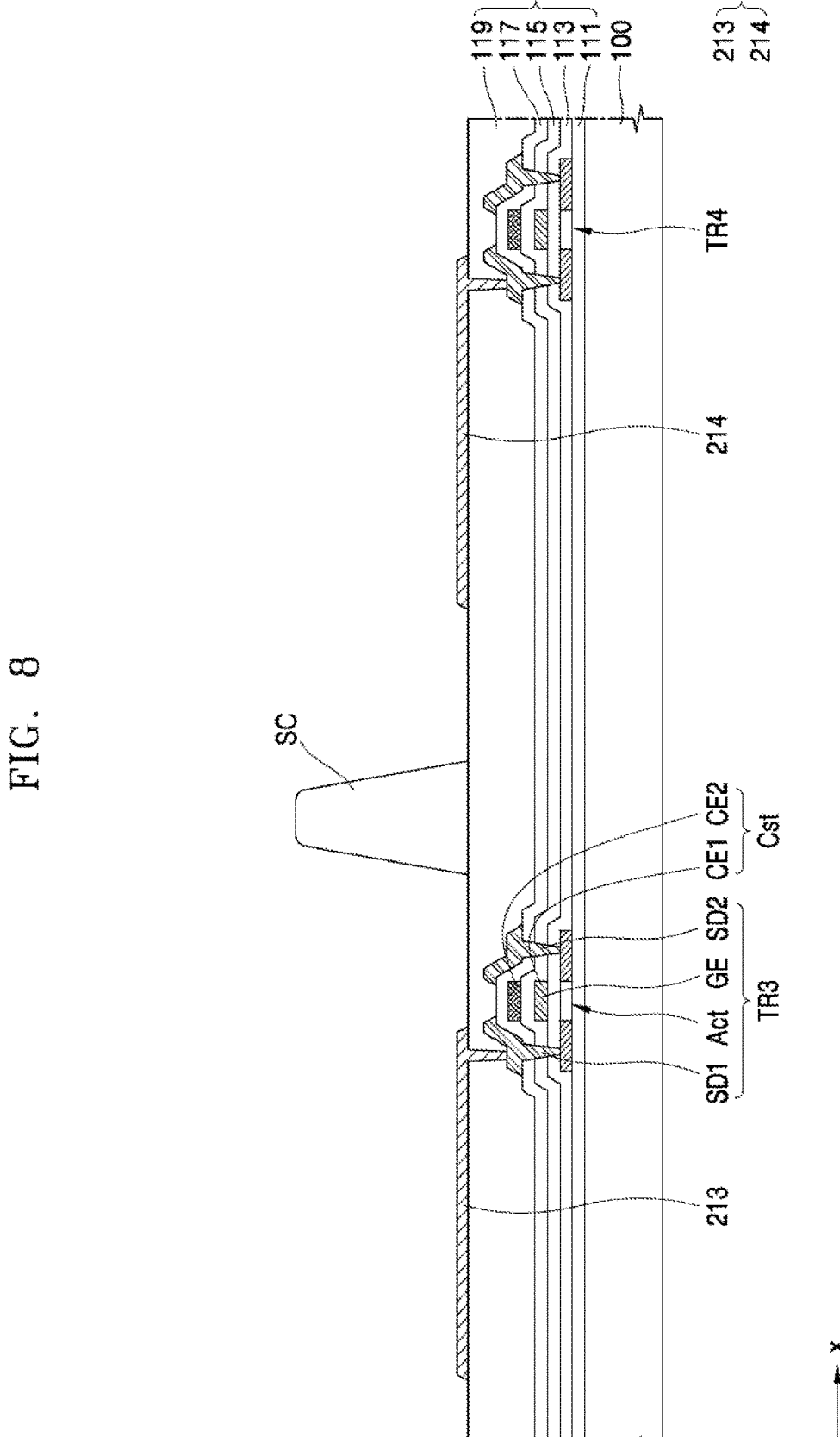

FIGS. 7 to 13 are schematic cross-sectional views of a method of manufacturing a display apparatus, according to an embodiment. FIGS. 7 and 9 to 13 are cross-sectional views showing, in manufacturing sequence, cross-sections of the display apparatus of FIG. 4 that are taken along line I-I' of FIG. 4. FIG. 8 is a cross-sectional view showing, in manufacturing sequence, a display apparatus of FIG. 4, taken along line II-II' of FIG. 4.

Referring to FIGS. 7 and 8, the pixel circuit layer PCL may be formed on the substrate 100, and the pixel electrodes 210 may be formed on the pixel circuit layer PCL.

The pixel circuit layer PCL may include the first transistor TR1 to the fourth transistor TR4. The first pixel electrode 211 to the fourth pixel electrode 214 may be apart from each other on the planarization layer 119. The first pixel electrode 211 may be electrically connected to the first transistor TR1, the second pixel electrode 212 may be electrically connected to the second transistor TR2, the third pixel electrode 213 may be electrically connected to the third transistor TR3, and the fourth pixel electrode 214 may be electrically connected to the fourth transistor TR4.

As shown in FIG. 8, the spacer SC may be apart from the first pixel electrode 211 to the fourth pixel electrode 214 on the planarization layer 119. The spacer SC may be apart from the first pixel electrode 211 to the fourth pixel electrode 214.

The spacer SC may be formed by spreading a positive-type photoresist on the planarization layer 119 and exposing portions, except for a location of the spacer SC, to light and developing the exposed portions.

Figure 9:
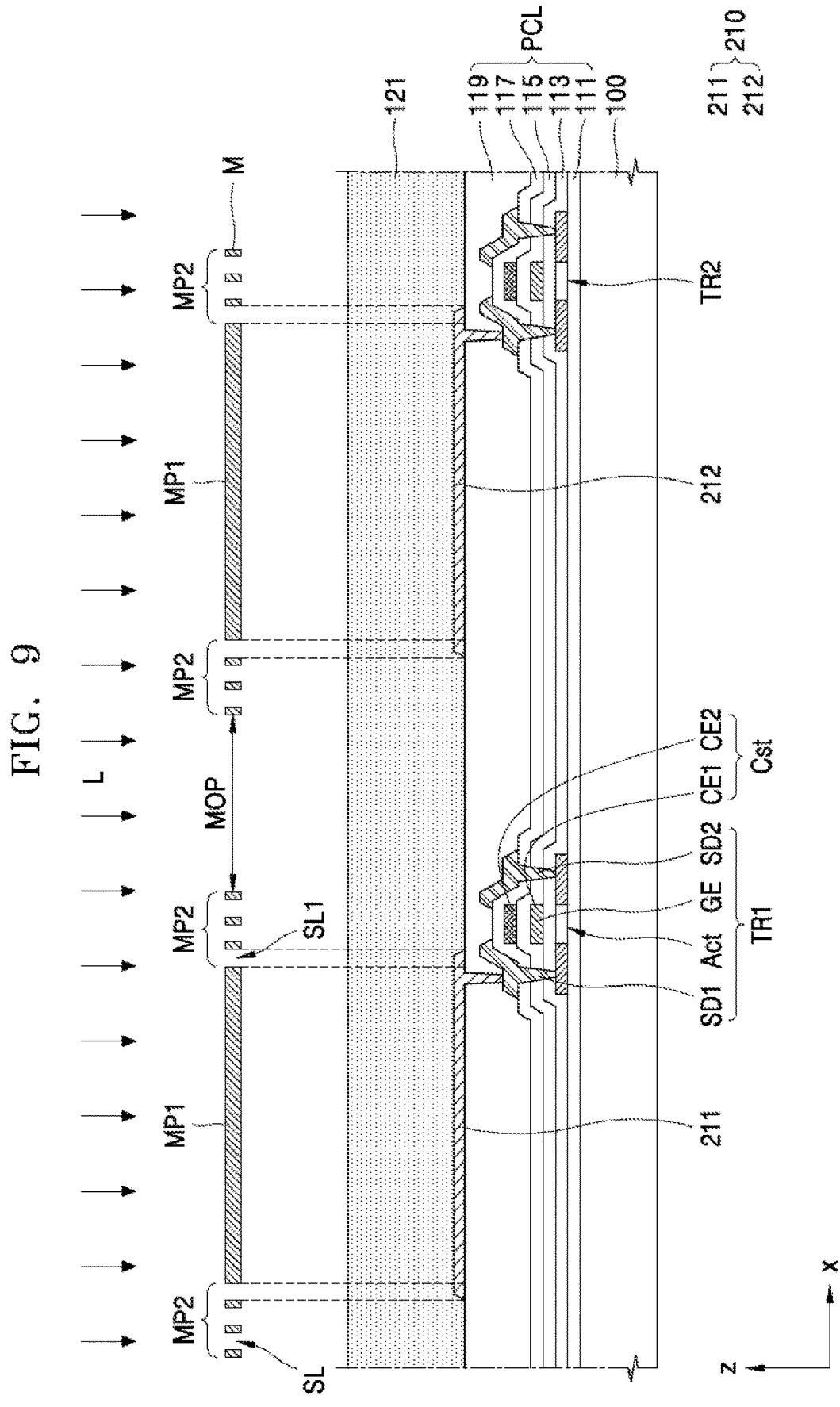

Referring to FIG. 9, a first organic layer 121 may be spread on the planarization layer 119 to cover the first pixel electrode 211 and the second pixel electrode 212. Although not shown in FIG. 9, the first organic layer 121 may cover the spacer SC (see FIG. 8), and because of the spacer SC, a step difference may be generated on an upper surface of the first organic layer 121.

The first organic layer 121 may include one or more of a fluorine-based monomer and a fluorine-based polymer containing the fluorine-based monomer. Here, the fluorine-based monomer may contain a fluorine atom and/or an alkyl group in which at least one hydrogen atom is substituted with a fluorine atom. The fluorine-based polymer may have a repeat unit derived from the above fluorine-based monomer and may be a homopolymer or a copolymer. The first organic layer 121 may be a negative-type photoresist to make a surface of the first organic layer 121 contain a fluorine atom and/or an alkyl group in which at least one hydrogen atom is substituted with a fluorine atom.

The first organic layer 121 may be light-exposed by using a mask M. In case that the mask M is arranged above the substrate 100, the mask M may include first mask patterns MP1 corresponding to the central portions of the pixel electrodes 210 and second mask patterns MP2 respectively surrounding the first mask patterns MP1 and having slits SL through which light L penetrates.

Here, a light source for irradiating light L may be excimer laser. The excimer laser may be laser having a wavelength in an ultraviolet region. For example, the excimer laser may be KrF excimer laser having a wavelength of about 248 nm. However, one or more embodiments are not limited thereto.

The first mask patterns MP1 and the second mask patterns MP2 may include light-shielding materials. Therefore, the light L, which is irradiated onto the first organic layer 121 with the mask M therebetween, may be blocked by the first mask patterns MP1 and the second mask patterns MP2.

In case that the mask M is arranged above the substrate 100, each of the first mask patterns MP1 may overlap a central portion of the first pixel electrode 211 and a central portion of the second pixel electrode 212, and each of the second mask patterns MP2 may overlap edges of the first pixel electrode 211 and edges of the second pixel electrode 212 in plan view.

The second mask pattern MP2 may have multiple slits SL. Each slit SL may have a loop shape surrounding the first mask pattern MP1 corresponding to the slit SL. For example, as shown in FIG. 4, in case that the bank opening 120OP has a rectangular shape having long sides in the first direction (e.g., the y direction) in plan view, the first mask pattern MP1 may have a rectangular shape having long sides in the first direction (e.g., the y direction). The second mask pattern MP2 may include light-shielding lines that surround the first mask pattern MP1 and are apart from each other by a certain distance. The slits SL may each be a region where the light L may pass, the region being located between the light-shielding lines.

Any of the slits SL, e.g., a slit SL1, may overlap an edge of its corresponding pixel electrode 210. For example, a portion of the first organic layer 121, which overlaps the edges of the pixel electrode 210, may be light-exposed by light L passing any of the slits SL, for example, the afore-mentioned slit SL1.

Some portions of the first organic layer 121, which are light-exposed by the light L passing an opening MOP on an outer side of the second mask pattern MP2 and the slits SL of the second mask pattern MP2, may be polymerized through crosslinking, etc.

Figure 10:
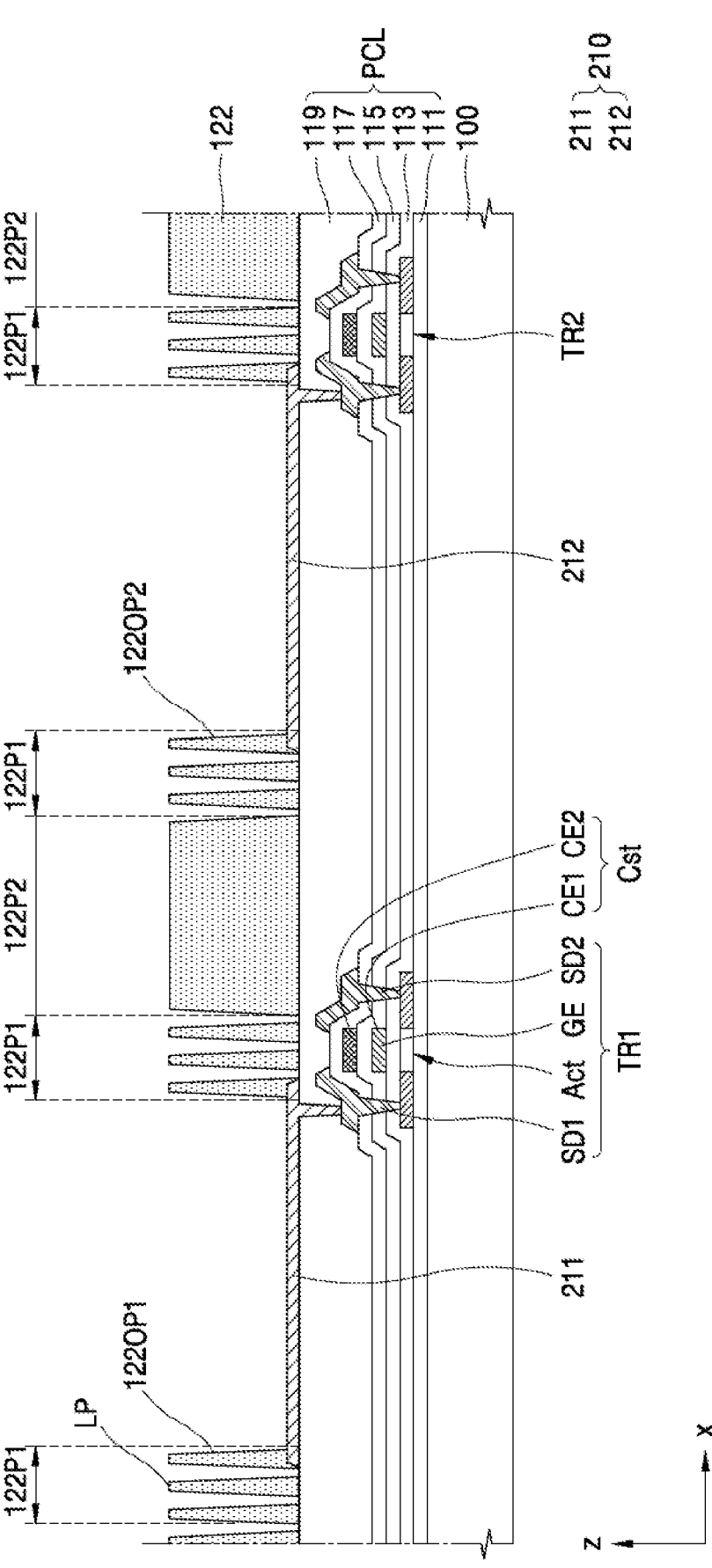

Referring to FIG. 10, an organic pattern layer 122 may be formed by developing the first organic layer 121 by using a developer, etc. The organic pattern layer 122 may include a first pattern 122P1 including multiple line patterns LP and a second pattern 122P2 arranged on an outer side of the first pattern 122P1. The line patterns LP of the first pattern 122P1 may correspond to the portions of the first organic layer 121 that are light-exposed through the slits SL of the second mask pattern MP2, and the second pattern 122P2 may correspond to the portion of the mask M that is light-exposed through the opening MOP. Although not shown, the second pattern 122P2 may overlap the spacer SC. For example, the organic pattern layer 122 may be formed to cover the spacer SC.

As regions of the first organic layer 121, where light is blocked by the first mask patterns MP1, are removed, a first pattern opening 122OP1 and a second pattern opening 122OP2 respectively exposing a central portion of the first pixel electrode 211 and a central portion of the second pixel electrode 212 may be formed. The regions of the first organic layer 121, where light is blocked by the second mask patterns MP2, may be removed, and thus, the line patterns LP may have gaps therebetween.

The first patterns 122P1 may overlap the edges of the pixel electrodes 210. For example, any of the line patterns LP may overlap edges of its corresponding pixel electrode 210. Therefore, in a process of forming the bank layer 120 by heating the organic pattern layer 122, the exposure of the edge of the pixel electrode 210 may be prevented.

In plan view, the first pattern 122P1 may have a loop shape surrounding the central portion of the pixel electrode 210. For example, as shown in FIG. 4, in case that the bank opening 120OP of the bank layer 120 has a rectangular shape having long sides in the first direction (e.g., they direction), the first pattern opening 122OP1 may have a rectangular shape having long sides in the first direction (e.g., the y direction). The first pattern 122P1 may extend along a periphery of the first pattern opening 122OP1. As described, each line pattern LP may have a loop shape surrounding the central portion of the pixel electrode 210.

Figure 11:
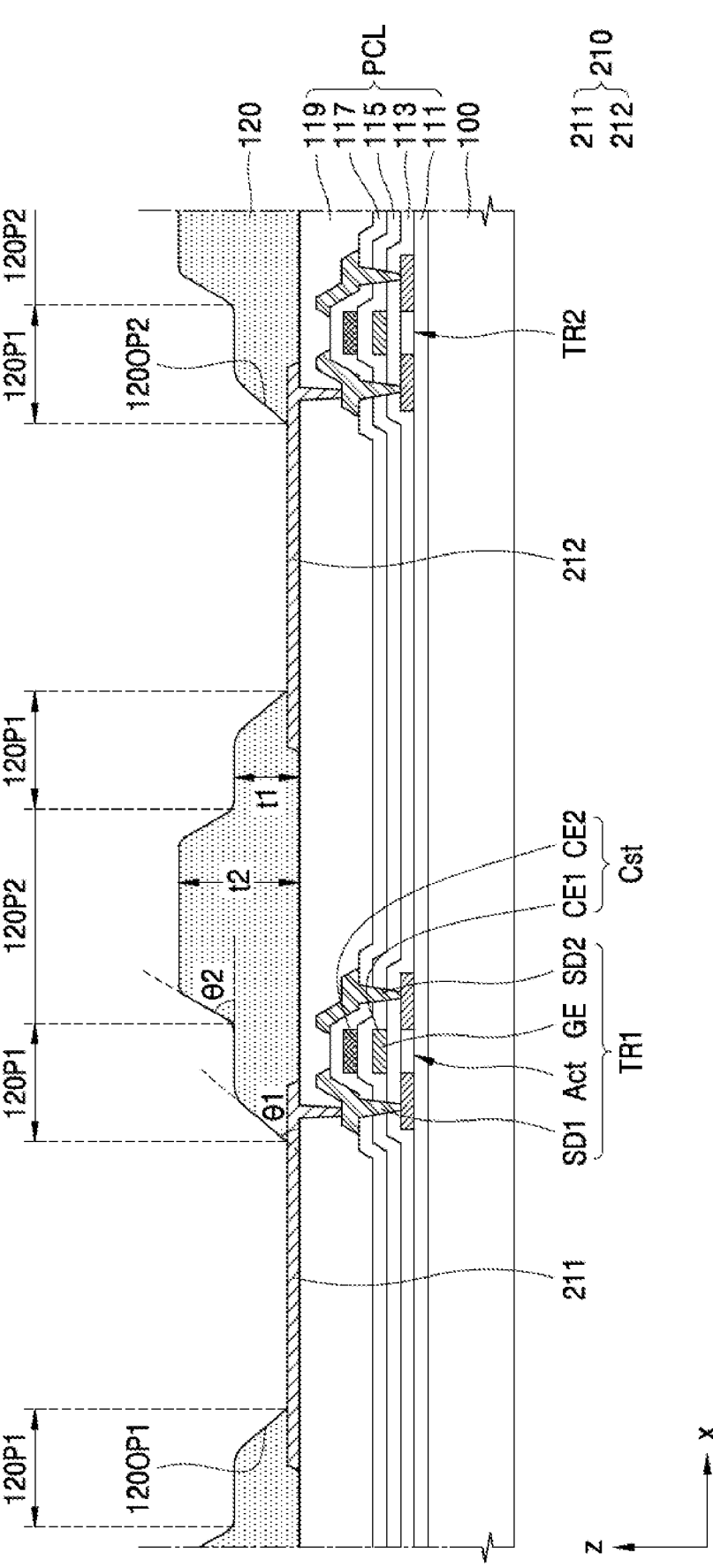

Referring to FIG. 11, the bank layer 120 may be formed by heating the organic pattern layer 122. The bank layer 120 may include the first banks 120P1 covering the edges of the pixel electrodes 210 and the second banks 120P2 arranged on the outer sides of the first bank 120P1. The first bank 120P1 may include the first bank opening 120OP1 exposing the central portion of the first pixel electrode 211 and the second bank opening 120OP2 exposing the central portion of the second pixel electrode 212.

The line patterns LP of the organic pattern layer 122 that have fluidity because of heat may fill gaps between the line patterns LP, and thus, the first bank 120P1 may be formed. Therefore, the first bank 120P1 may have the first thickness t1 that is less than that of the organic pattern layer 122. As the first thickness t1 of the first bank 120P1 decreases, an angle θ1 formed by the sidewalls of the first bank 120P1 defining the first bank opening 120OP1 with the upper surface of the first pixel electrode 211 may be reduced to be less than or equal to about 50°.

As described, the second pattern 122P2 of the organic pattern layer 122, which has fluidity because of heat, may fill gaps between the first pattern 122P1 and the second pattern 122P2, and thus, the second bank 120P2 may be formed. The second bank 120P2 may have a second thickness t2 greater than the first thickness t1. An angle θ2 formed by the upper surface of the first bank 120P1 and the sidewalls of the second bank 120P2, which connect the upper surface of the first bank 120P1 to the upper surface of the second bank 120P2, may be reduced to be less than or equal to about 50°.

As a Comparative Example, in case that an organic pattern layer does not include line patterns that are apart from each other, an angle formed by an upper surface of a pixel electrode and sidewalls of a bank layer defining a bank opening may be greater than 50°. As described above, in case that the angle formed by the sidewalls of the bank layer and the upper surface of the pixel electrode is greater than 50°, an opposite electrode having a low step coverage may be disconnected.

As the bank layer 120 is formed by heating the organic pattern layer 122 including the first pattern 122P1 including the line patterns LP, which are apart from each other, and the second pattern 122P2 arranged on the outer side of the first pattern 122P1, the bank layer 120 may have a gentle slope.

Figure 12:
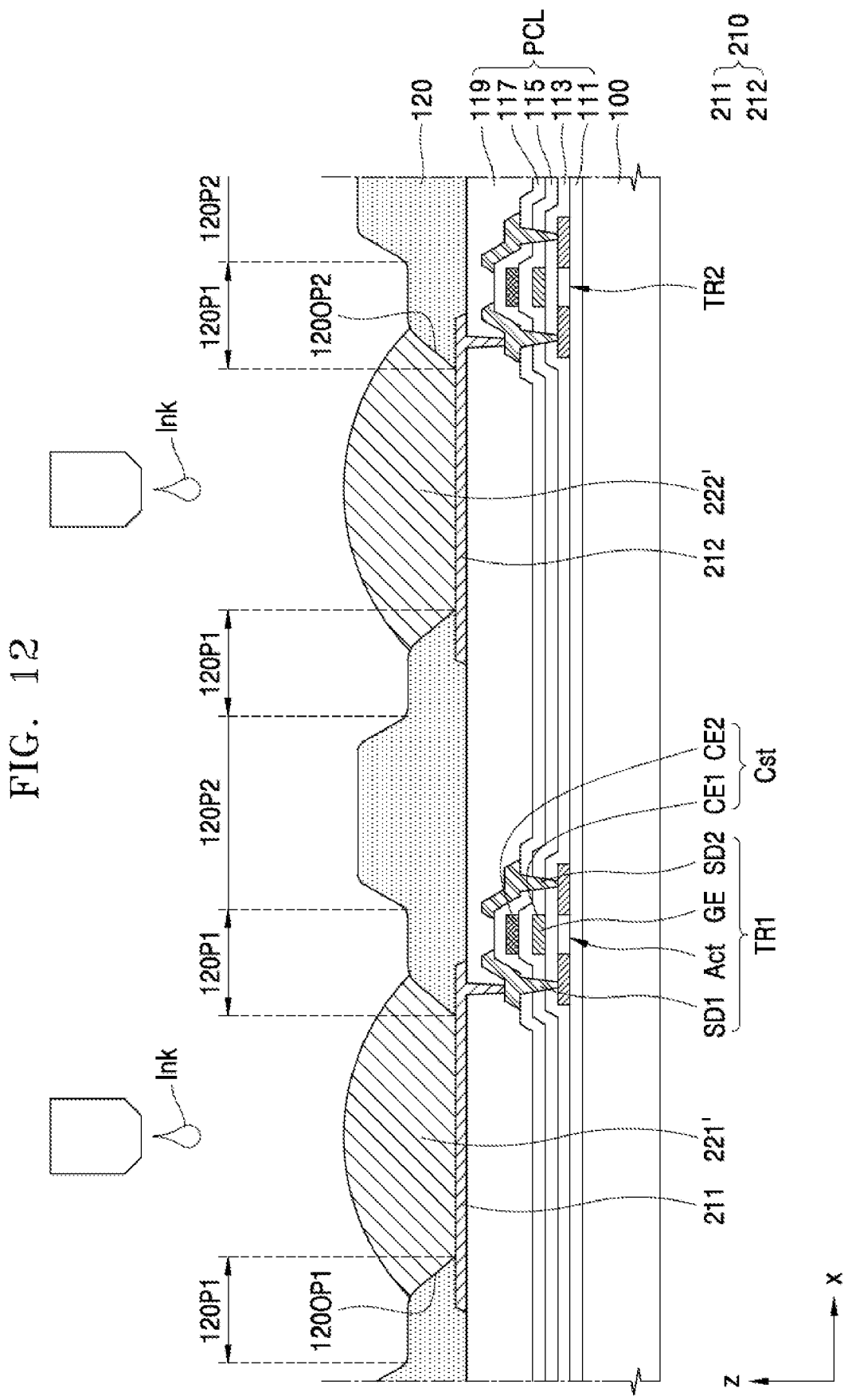

Referring to FIG. 12, a material 221' for forming a first emission layer may be formed on the first pixel electrode 211 and a material 222' for forming a second emission layer may be formed on the second pixel electrode 212 by discharging ink including a light-emitting material.

In an embodiment, the material 221' for forming a first emission layer and the material 222' for forming a second emission layer may be formed through an inkjet printing process.

Because the surface of the bank layer 120 is liquid-repellent, the material 221' may be in the first bank opening 120OP1, and the material 222' may be in the second bank opening 120OP2. Therefore, emission layers may be accu-rately formed at desired locations even in a high-resolution display apparatus.

In an embodiment, the material 221' for forming a first emission layer and the material 222' for forming a second emission layer may each have a convex shape having a central portion with a great thickness by considering surface tension and shrinkage in volume after drying the materials 221' and 222'. In another embodiment, according to an injection amount of ink including a light-emitting material, the material 221' for forming a first emission layer and the material 222' for forming a second emission layer may each have a flat shape or a concave shape.

Figure 13:
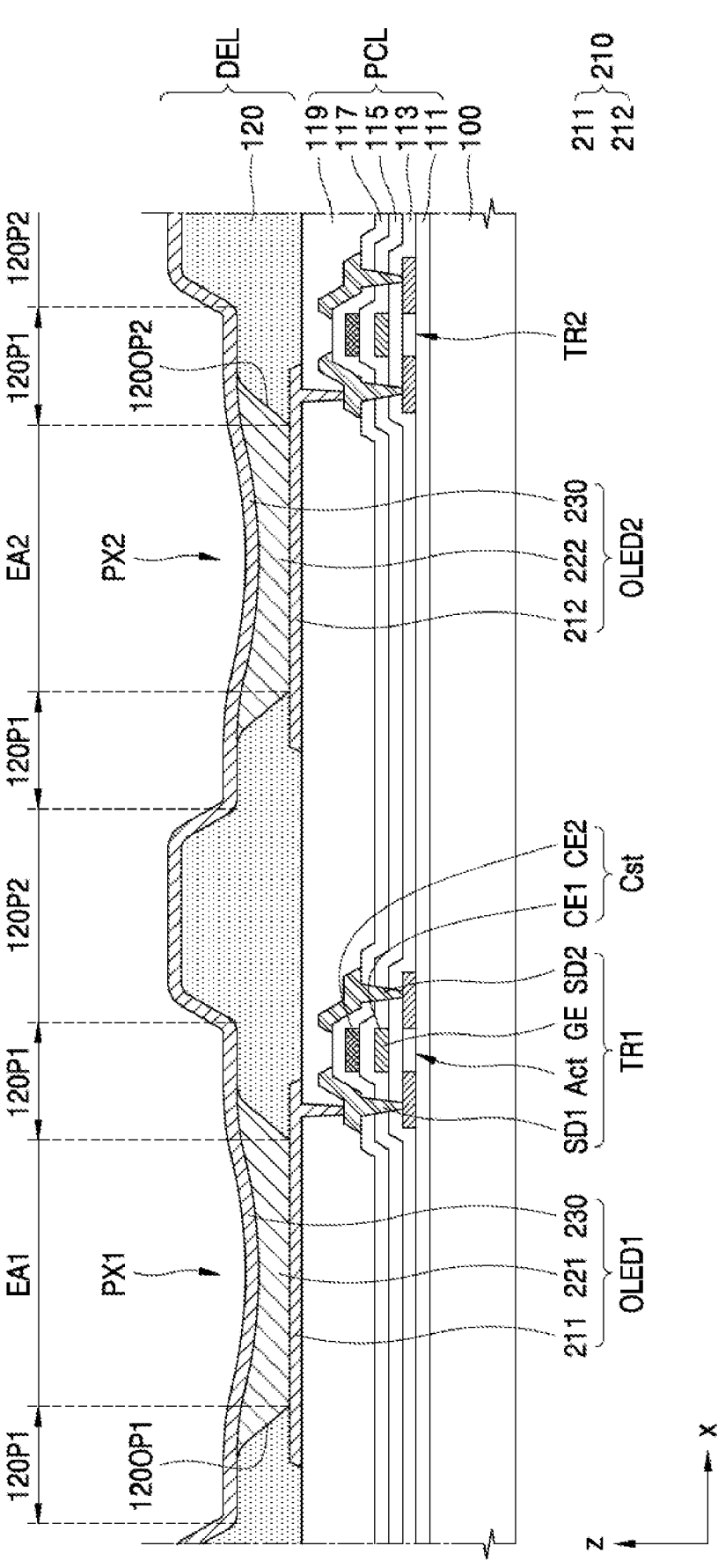

Referring to FIG. 13, the first emission layer 221 and the second emission layer 222 may be respectively formed by drying the material 221' for forming a first emission layer and the material 222' for forming a second emission layer.

In an embodiment, as the solvent of the ink including the light-emitting material evaporates, each of the first emission layer 221 and the second emission layer 222 may have a concave shape of which a thickness increases towards the edge of the first opening 120OP from the central portion of each of the first emission layer 221 and the second emission layer 222.

The opposite electrode 230 may be formed on the bank layer 120, the first emission layer 221, and the second emission layer 222. The opposite electrode 230 may be integrally formed over the entire substrate 100.

As described above, as the bank layer 120 is formed by using the slit mask, the sidewalls of the first bank 120P1, which connect the upper surface of the pixel electrode 210 to the upper surface of the first bank 120P1, and the sidewalls of the second bank 120P2, which connect the upper surface of the first bank 120P1 to the upper surface of the second bank 120P2, may each have a gentle slope. Therefore, a display apparatus having improved display quality may be provided by decreasing or preventing the disconnection of the opposite electrode 230.

Although not shown, a process of forming a thin-film encapsulation layer or an encapsulation substrate on the opposite electrode 230 may be further included.

Figure 14:
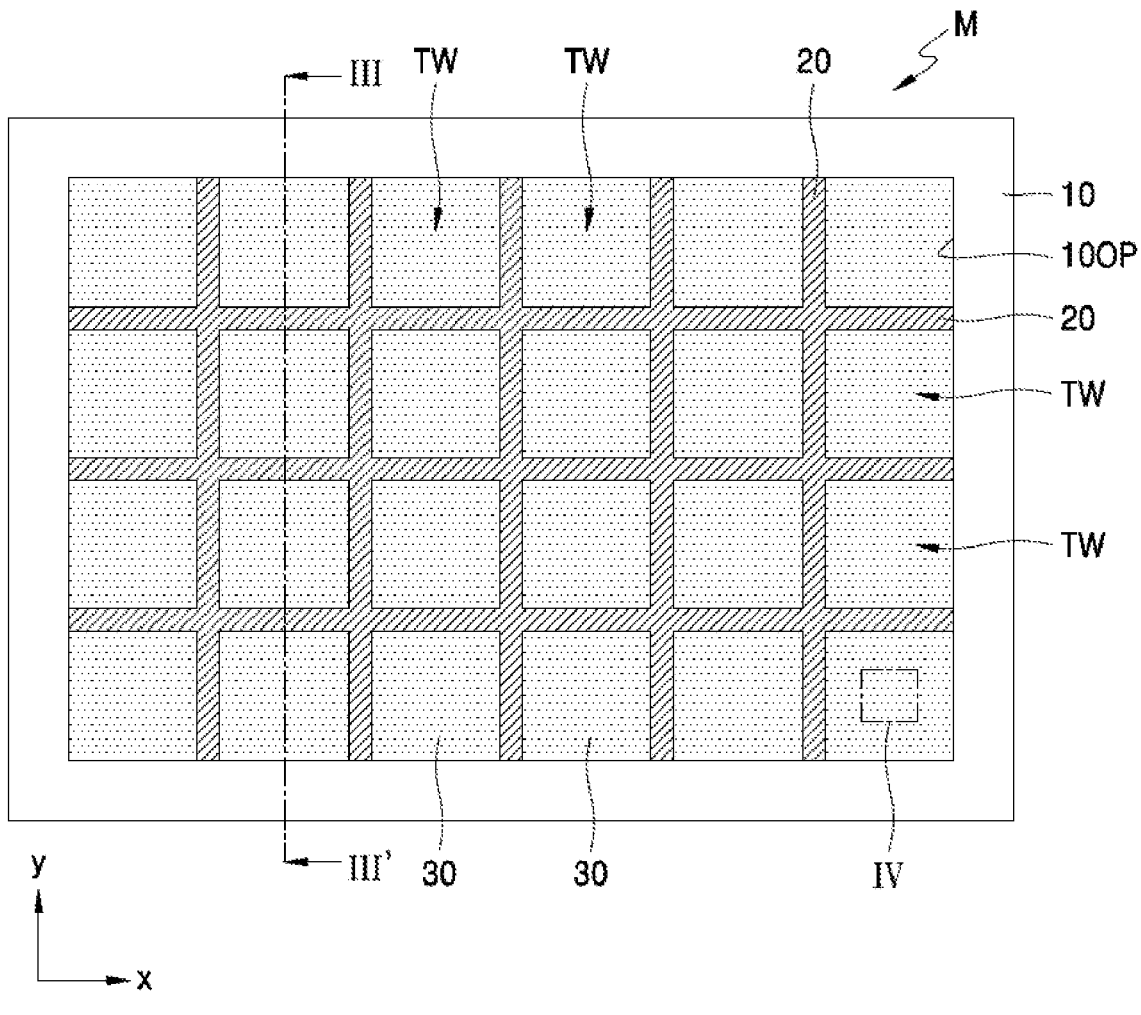
FIGS. 14 to 16 are a cross-sectional view and plan views schematically showing a mask used for a method of manufacturing a display apparatus, according to an embodiment.
Figure 15:
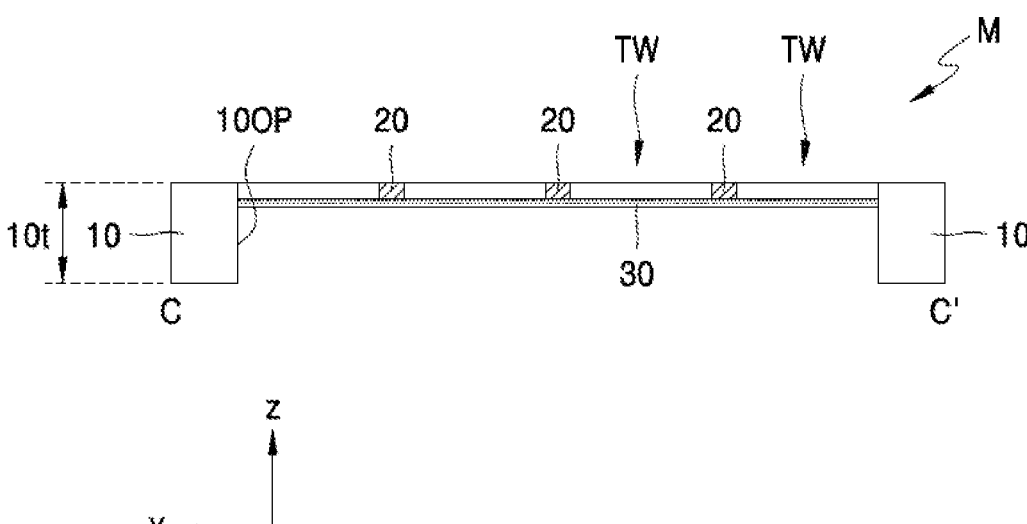
Figure 16:
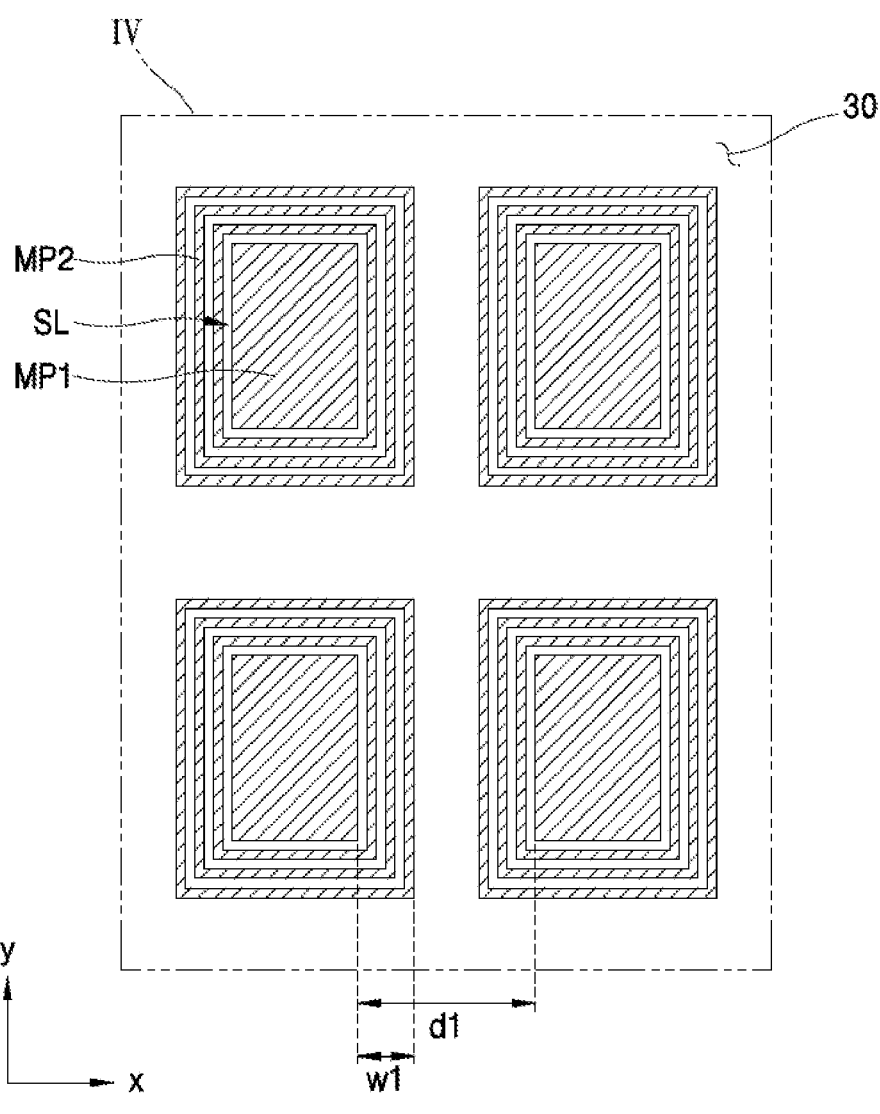

FIGS. 14 to 16 are a cross-sectional view and plan views schematically showing a mask used during a method of manufacturing a display apparatus, according to an embodiment.

Referring to FIG. 14, the mask M includes a frame portion 10, rib portions 20, and an organic film 30.

The frame portion 10 may include an opening 10OP at the center thereof. The shape of the frame portion 10 is substantially a rectangle according to a size of a mother substrate, but one or more embodiments are not limited thereto. Like an open mask, the frame portion 10 may include a metal material and have a thickness 10t of between about several tens of millimeters (mm) to several centimeters (cm). A mask M may effectively adhere to the mother substrate by the frame portion 10, and as a central portion of the mask M sags, the occurrence of defects during the manufacture of the display apparatus may be considerably reduced.

The rib portion 20 may cross the opening 10OP of the frame portion 10, and an end and another end of the rib portion 20 may be connected to the frame portion The rib portion 20 may be provided in plural vertically and horizontally so that the rib portions 20 have a brace shape with a small width. Multiple transmission windows TW may be provided between the rib portions 20. A transmission window TW may correspond to a cell corresponding to a display apparatus. A transmission window TW may correspond to a display area of the display apparatus.

The rib portion 20 may include a metal material. A thickness of the rib portion may be between about several tens of micrometers (μm) to several mm, which is much less than the thickness 10t of the frame portion 10. The rib portion 20 may prevent the central portion of the mask M from sagging.

The organic film 30 may correspond to the opening 10OP of the frame portion The organic film 30 may be on a surface of the rib portion 20. A portion of the organic film 30 may overlap the rib portion 20. FIG. 15 shows that the organic film 30 is disposed on a lower surface of the rib portion 20.

The organic film 30 may include an organic material that is light-transmissive. For example, the organic film 30 may include PI, PET, and/or the like. The organic film may include a flexible material.

FIGS. 14 and 15 show that the mask M includes the organic film 30, but in another embodiment, the mask M may include a glass material.

Referring to FIG. 16, the organic film 30 may include first mask patterns MP1 and second mask patterns MP2, each of which includes a light-shielding material. The first mask pattern MP1 may spread to correspond to a central portion of a pixel electrode in case that the mask M is arranged on a substrate of a display apparatus. The second mask pattern MP2 may surround the first mask pattern MP1 and include multiple slits SL through which light passes. The slits SL may each have a loop shape surrounding the first mask pattern MP1 and may be apart from each other. An opening may be located in an outer side of the second mask pattern MP2, wherein no light-shielding material is spread in the opening.

The first mask patterns MP1, which are adjacent to each other, may be spaced apart from each other in the second direction (e.g., the x direction) by a first distance d1. A first width w1 of the second mask pattern MP2 in the second direction (e.g., the x direction) may be about 30% to about 35% of the first distance d1. For example, the first distance d1 may be about 10 μm, and the first width w1 may be about 3 μm. A width of the slit SL may be less than or equal to about 1 μm.

The light-shielding material may include, for example, at least one of a black pigment, a black dye, and a black particle. In some embodiments, the light-shielding material may include Cr or $CrO_x$, $Cr/CrO_x$, $Cr/CrO_x/CrNy$, resin, a carbon pigment, graphite, a non-Cr-based material, or the like.

In the specification, a bank layer may be formed using a mask M having multiple slits SL so that the bank layer may have a gentle slope. Therefore, a display apparatus having improved display quality may be provided by decreasing or preventing disconnection of an opposite electrode.

According to the one or more embodiments described above, a display apparatus having improved display quality by reducing a brightness difference between pixels according to locations of the pixels, a mask for manufacturing the display apparatus, and a method of manufacturing the display apparatus may be realized. However, the scope of the disclosure is not limited by the effects discussed herein.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure.

What is claimed is:

1. A display apparatus comprising:
   a substrate;
   an insulating layer on the substrate;
   a pixel electrode disposed on the insulating layer;
   a first bank comprising a bank opening exposing a central portion of the pixel electrode;
   a second bank disposed on an outer side of the first bank and including a greater thickness than the first bank;
   an emission layer disposed in the bank opening and corresponding to the pixel electrode; and
   an opposite electrode overlapping the first bank, the second bank, and the emission layer,
   wherein the first bank and the second bank are contiguous regions of a single layer patterned from the same negative-type photoresist film,
   wherein, in plan view, the first bank has a loop shape that surrounds the central portion of the pixel electrode, and
   wherein the first bank and the second bank contact the insulating layer.

2. The display apparatus of claim 1, wherein the first bank and the second bank are integral with each other.

3. The display apparatus of claim 1, wherein a thickness of the first bank is less than or equal to about half of a thickness of the second bank.

4. The display apparatus of claim 1, wherein a thickness of the second bank is about 300 nm to about 3 μm.

5. The display apparatus of claim 1, wherein an angle formed by sidewalls of the first bank with an upper surface of the pixel electrode is greater than 0° and less than or equal to about 50°.

6. The display apparatus of claim 1, wherein an angle formed by sidewalls of the second bank with an upper surface of the first bank is greater than 0° and less than or equal to about 50°.

7. The display apparatus of claim 1, wherein a surface of each of the first bank and the second bank is liquid-repellent.

8. The display apparatus of claim 1, further comprising:
a spacer disposed on the substrate to be apart from the pixel electrode; and
a third bank overlapping the spacer and protruding from an upper surface of the second bank.

9. The display apparatus of claim 8, wherein the first bank, the second bank, and the third bank are integral with each other.

10. The display apparatus of claim 8, wherein the spacer comprises a positive-type photoresist.

11. A method of manufacturing a display apparatus, the method comprising:
forming a pixel electrode on a substrate;
forming, on the pixel electrode, a first organic layer comprising a negative-type photoresist;
irradiating light onto the first organic layer by using a slit mask and developing the first organic layer into an organic pattern layer;
forming a first bank and a second bank by heating the organic pattern layer, the first bank comprising a bank opening exposing a central portion of the pixel electrode, and the second bank being disposed on an outer side of the first bank and being greater in thickness than the first bank;
forming an emission layer in the bank opening, in correspondence with the pixel electrode; and
forming an opposite electrode to overlap the first bank, the second bank, and the emission layer.

12. The method of claim 11, wherein the organic pattern layer comprises:
a first pattern comprising a plurality of line patterns; and
a second pattern disposed on an outer side of the first pattern.

13. The method of claim 12, wherein any one of the plurality of line patterns overlaps an edge of the pixel electrode.

14. The method of claim 12, wherein each of the plurality of line patterns has a loop shape surrounding the central portion of the pixel electrode in plan view.

15. The method of claim 11, further comprising:
forming a spacer that is apart from the pixel electrode, wherein the forming is performed between the forming of the pixel electrode and the forming of the first organic layer.

16. The method of claim 15, wherein, in the forming of the first bank and the second bank, a third bank overlapping the spacer and protruding from an upper surface of the second bank is formed.

17. The method of claim 15, wherein the spacer comprises a positive-type photoresist.

18. The method of claim 11, wherein the forming of the emission layer comprises forming an emission layer by discharging ink comprising a light-emitting material into the bank opening.

19. The method of claim 11, wherein an angle formed by sidewalls of the first bank with an upper surface of the pixel electrode is greater than 0° and less than or equal to about 50°.

20. The method of claim 11, wherein an angle formed by sidewalls of the second bank with an upper surface of the first bank is greater than 0° and less than or equal to about 50°.

21. The method of claim 11, wherein a surface of each of the first bank and the second bank is liquid-repellent.

22. A mask used to manufacture a display apparatus, the mask comprising:
a light-transmissive layer;
a plurality of first mask patterns configured to align with a plurality of pixel electrodes of the display apparatus and formed on the light-transmissive layer; and
a plurality of second mask patterns, each second mask pattern comprising a plurality of slits through which light is capable of passing, the plurality of second mask patterns being formed on the light-transmissive layer,
wherein each of the plurality of second mask patterns is configured to surround a corresponding first mask pattern, and
wherein first mask patterns adjacent to each other among the plurality of first mask patterns are spaced apart from each other in a first direction by a first distance, and a width of each second mask pattern in the first direction is 30% to 35% of the first distance.

23. The mask of claim 22, wherein, in plan view, each of the plurality of slits has a loop shape configured to surround the first mask pattern.

24. The mask of claim 22, wherein any one of the plurality of slits is configured to align with an edge of the first mask pattern.

* * * * *